(12) United States Patent
Nomoto et al.

(10) Patent No.: US 7,012,329 B2
(45) Date of Patent: *Mar. 14, 2006

(54) MEMORY TRANSISTOR ARRAY UTILIZING INSULATED WORD LINES AS GATE ELECTRODES

(75) Inventors: Kazumasa Nomoto, Kanagawa (JP); Toshio Kobayashi, Kanagawa (JP); Akihiro Nakamura, Kanagawa (JP); Ichiro Fujiwara, Kanagawa (JP); Toshio Terano, Kanagawa (JP)

(73) Assignee: Sony Corporation, (JP)

( * ) Notice: Subject to any disclaimer, the term of this patent is extended or adjusted under 35 U.S.C. 154(b) by 35 days.

This patent is subject to a terminal disclaimer.

(21) Appl. No.: 11/098,503

(22) Filed: Apr. 5, 2005

(65) Prior Publication Data

US 2005/0189570 A1    Sep. 1, 2005

Related U.S. Application Data

(63) Continuation of application No. 10/196,636, filed on Jul. 17, 2002, now Pat. No. 6,891,262.

(30) Foreign Application Priority Data

| Jul. 19, 2001 | (JP) | ............................ P2001-219669 |
| Sep. 19, 2001 | (JP) | ............................ P2001-285100 |
| Jan. 16, 2002 | (JP) | ............................ P2002-007085 |

(51) Int. Cl.
    *H01L 29/76* (2006.01)

(52) U.S. Cl. ...................... 257/690; 257/692; 257/696; 257/700; 257/758; 257/773

(58) Field of Classification Search .................... None
    See application file for complete search history.

(56) References Cited

U.S. PATENT DOCUMENTS

| 5,306,941 A | 4/1994 | Yoshida ........................ 257/390 |
| 5,877,537 A | 3/1999 | Aoki ............................ 257/390 |
| 6,381,166 B1 | 4/2002 | Yoshida et al. ................ 365/63 |
| 6,765,271 B1 | 7/2004 | Iiijima .......................... 257/390 |
| 6,891,262 B1 * | 5/2005 | Nomoto et al. .............. 257/692 |
| 2001/0052958 A1 | 12/2001 | Ogawa ......................... 349/139 |

* cited by examiner

*Primary Examiner*—Alonzo Chambliss
(74) *Attorney, Agent, or Firm*—Rader, Fishman & Grauer PLLC; Ronald P. Kananen

(57) ABSTRACT

A semiconductor device enabling word lines to be arranged at close intervals, comprising a plurality of memory transistors arranged in an array and a plurality of word lines serving also as gate electrodes of memory transistors in a same row, extending in a row direction, and repeating in a column direction, where insulating films are formed between the plurality of word lines to insulate and isolate the word lines from each other and where a dimension of separation of word lines is defined by the thickness of the insulating films.

1 Claim, 39 Drawing Sheets

A—A SECTION

B—B SECTION

A—A SECTION

| MEASUREMENT POINT | 1 | 2 | 3 | 4 | 5 | AVERAGE |
|---|---|---|---|---|---|---|
| WEFER A | 15.61 | 15.53 | 18.53 | 16.61 | 15.48 | 16.35 |
| WEFER B | 19.48 | 20.06 | 19.36 | 19.38 | 19.56 | 19.57 |

[ WEFER A: RTN AT TIME OF FORMATION OF 1ST ONO (1000°C, 60 SEC) ]
[ WEFER B: NO RTN AT TIME OF FORMATION OF 1ST ONO ]

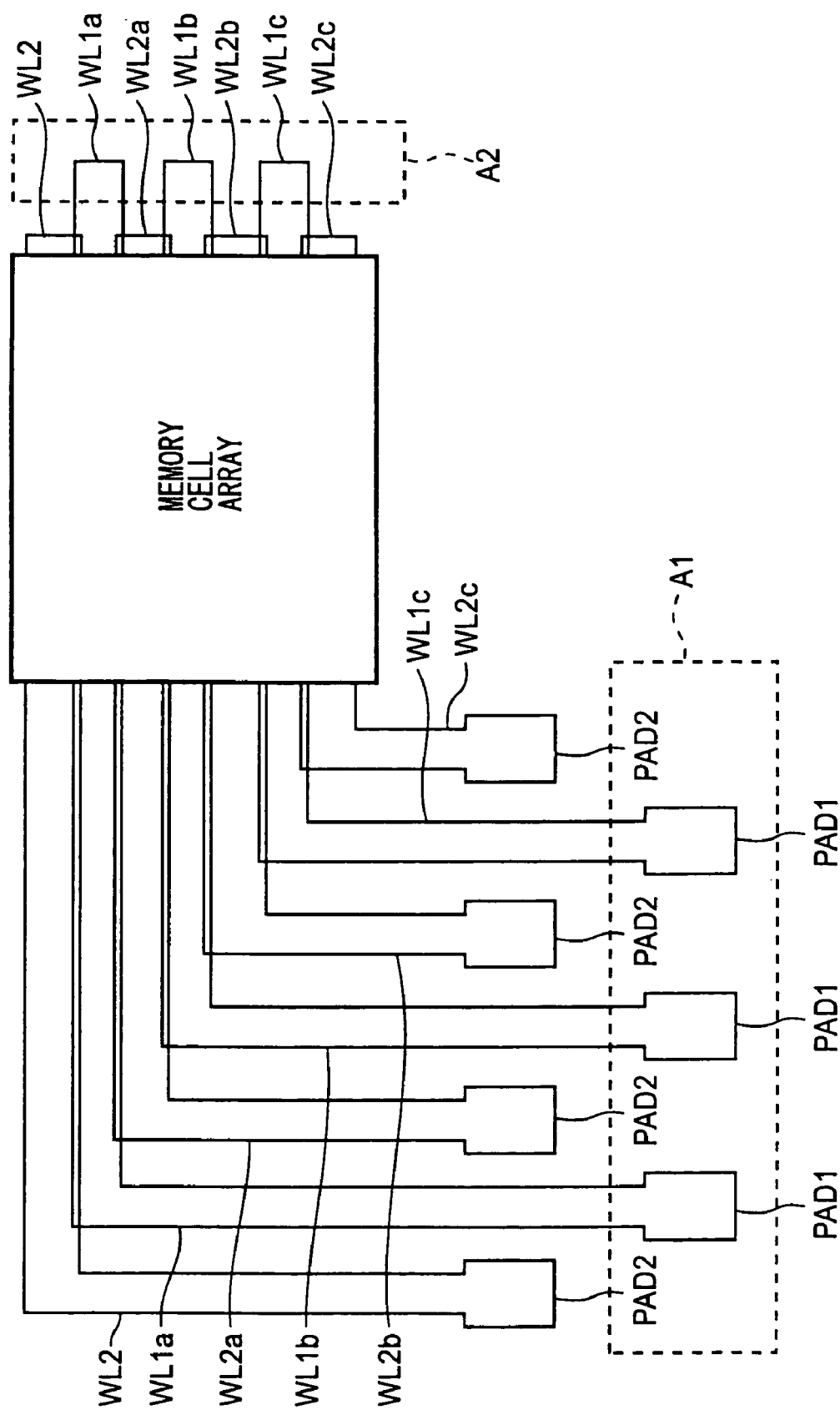

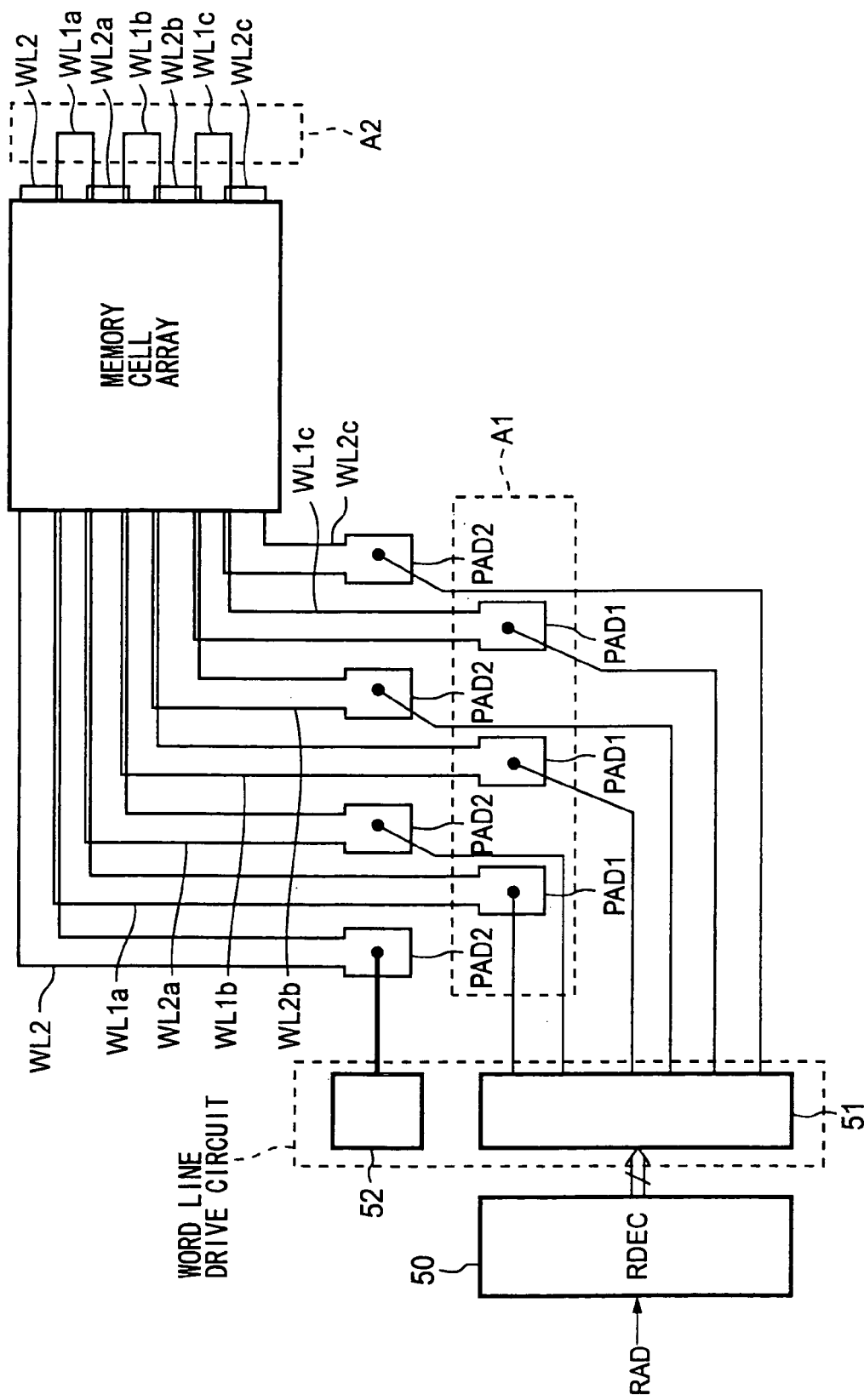

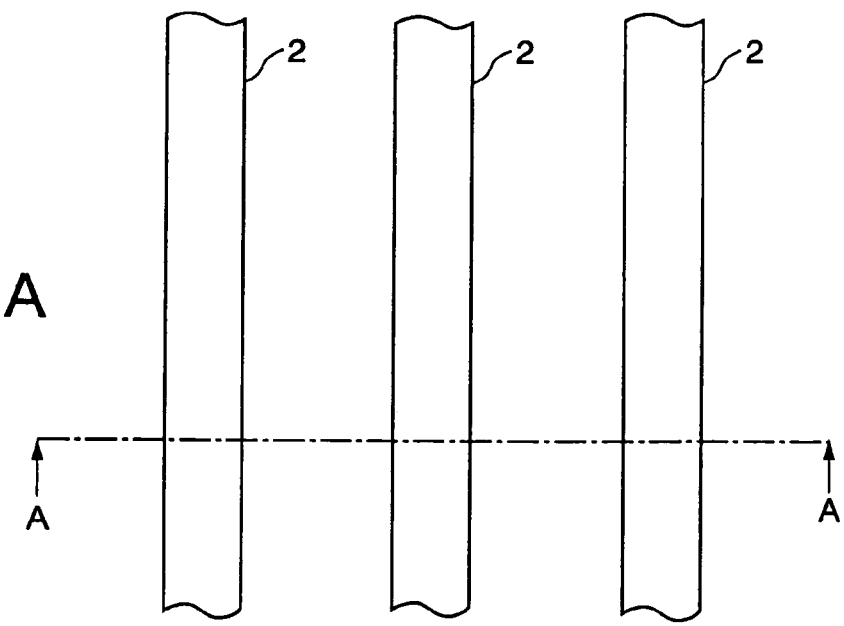
FIG.23A
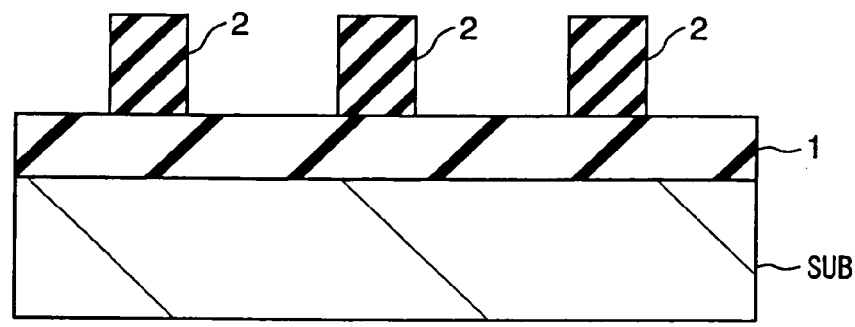
FIG.23B
FIG.24
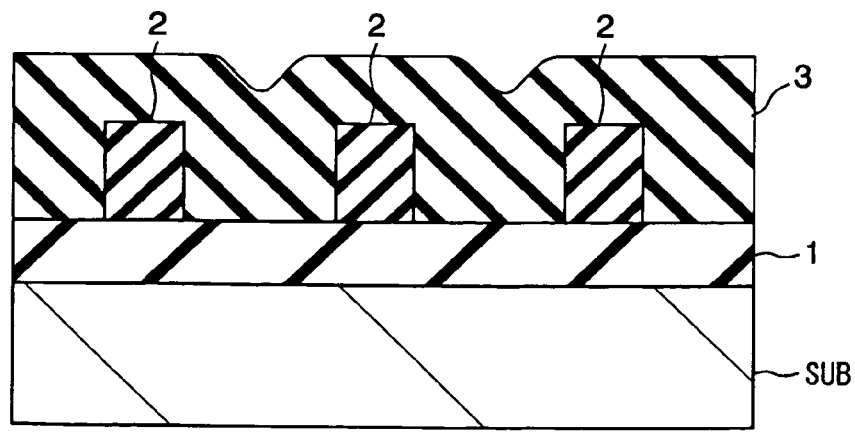

A-A SECTION

B-B SECTION

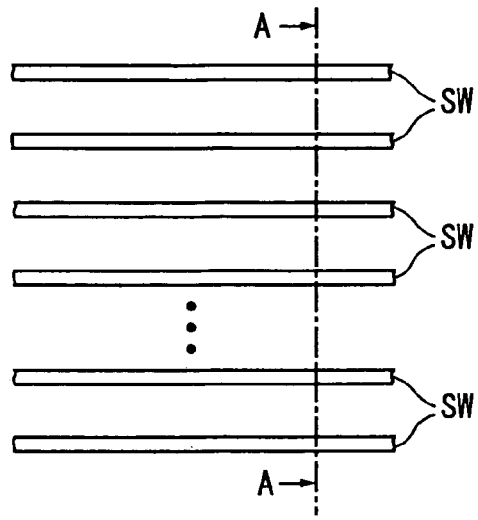
FIG. 45A
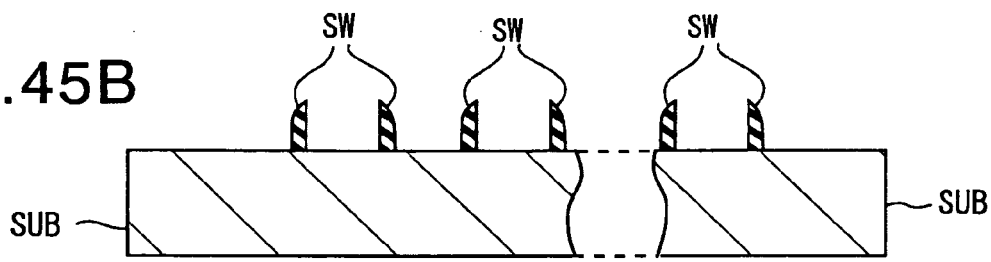
FIG. 45B
FIG. 46
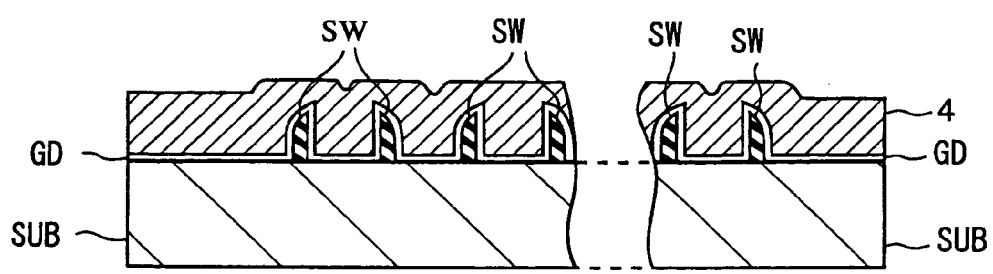

MEMORY TRANSISTOR ARRAY UTILIZING INSULATED WORD LINES AS GATE ELECTRODES

This is a continuation of application Ser. No. 10/196,636, filed Jul. 17, 2002 now U.S. Pat. No. 6,891,262, the entire contents of which are hereby incorporated by reference.

BACKGROUND OF THE INVENTION

1. Field of the Invention

The present invention relates to a semiconductor device having a plurality of interconnect lines arranged in parallel with each other, for example, word lines of a memory cell array, and a method of producing a semiconductor device shortening the distance between interconnect lines to the maximum extent.

2. Description of the Related Art

The word lines of for example a flash electrically erasable and programmable read only memory (flash EEPROM) or other nonvolatile memory device serve also as gate electrodes of the memory transistors and are arranged extending in a row direction of the memory cell array. These word lines are repeatedly arranged at predetermined intervals in the column direction. When bit lines are formed by patterning a metal, polycrystalline silicon, etc., the bit lines are also arranged in parallel to each other at predetermined intervals.

As other interconnect lines arranged in this way, there are word lines or bit lines of other memories (other read only memories (ROMs) or random access memories (RAMs)), gate lines of gate arrays, and numerous other interconnect lines.

When patterning such interconnect lines, first a conductive material is formed, then a resist is coated on the conductive material and patterns on a reticle or other photomask are transferred to the resist. Using the resist to which the patterns have been transferred as a mask, the conductive material is then etched and patterned.

Alternatively, a material with a stronger resistance to etching is interposed between the conductive material and resist, then the patterns of the resist are transferred once to the layer of the material with the strong etching resistance. Next, the layer of the material with the strong etching resistance to which the patterns are transferred is used as a mask to etch and pattern the conductive material.

Summarizing the problems to be solved by the invention, with these methods, it is not possible to pattern the material at under the resolution limit of photolithography, which is dependent on the wavelength of the light used.

As a method for patterning a material at under the resolution limit of photolithography, the so-called "phase shift method" is known.

There is however a limit to the reduction of the distance between interconnect lines by this method. It is not possible to reduce the distance between interconnect lines to an extreme extent.

Therefore, in semiconductor memories of the related art, for example, the general practice has been to form the word lines in parallel stripes spaced apart from each other by the same extent as the widths as the word lines. This wasted space in the column direction and has been one factor obstructing the reduction of the bit cost.

The problem of the limit to reduction of area due to the interconnect line pitch is basically found in all semiconductor devices with numerous fine repeating interconnect line patterns such as other interconnect lines of the memory devices and interconnect lines of gate arrays.

SUMMARY OF THE INVENTION

A first object of the present invention is to provide a semiconductor device including a plurality of interconnect lines of isolated structures enabling arrangement at a much closer distance than in the past.

A second object of the present invention is to provide a method of producing a semiconductor device enabling formation of a plurality of interconnect lines at a much closer distance than in the past while isolating them from each other.

To attain the first object, according to a first aspect of the present invention, there is provided a semiconductor device comprising a plurality of memory transistors arranged in an array, a plurality of word lines serving also as gate electrodes of memory transistors in a same row, arranged extending in a row direction, and repeating at distances in a column direction, and an insulating film being formed between the word lines so that the word lines are insulated and isolated from each other, the device wherein a dimension of the distance between word lines is defined by a thickness of the insulating film.

To attain the first object, according to a second aspect of the present invention, there is provided a semiconductor device having a plurality of interconnect lines arranged in parallel with each other and having adjoining interconnect lines isolated by an insulator, wherein an insulator between the interconnect lines comprises a sidewall insulating layer formed at one side surface of two adjoining interconnect lines and having an approximately ¼ circular sectional shape.

To attain the first object, according to a third aspect of the present invention, there is provided a semiconductor device having a plurality of interconnect lines arranged in parallel with each other and having adjoining interconnect lines isolated by an insulator, wherein the insulator between the interconnect lines, comprises a sidewall insulating layer formed at one side surface of two adjoining interconnect lines and having an approximately ¼ circular sectional shape, and an insulating film formed between the sidewall insulating layer and the interconnect line and having a dimension in the direction of separation of the sidewall insulating layer and the interconnect line defined by the film thickness.

In the semiconductor devices of the first to third aspects of the invention, a plurality of interconnect lines (hereinafter including word lines) are arranged extending in one direction in parallel. Here, "arranged extending in one direction" does not require that the interconnect lines be necessarily straight. It also includes the case where they for example wind toward the same direction.

The interconnect lines are isolated by insulators. In the first aspect of the invention, adjoining interconnect lines are isolated by an insulating film interposed so that the distance between the interconnect lines becomes the film thickness. In the second aspect of the invention, adjoining interconnect lines are isolated by a sidewall insulating layer formed at one side surface of the adjoining interconnect lines. In the third aspect of the invention, adjoining interconnect lines are isolated by a sidewall insulating layer and insulating film interposed between the sidewall insulating layer and one interconnect line so that the distance between them becomes the film thickness.

In these semiconductor devices, since the distance between interconnect lines is determined by the thickness of the insulating film and/or width of the sidewall insulating layer, the distance between interconnect lines is much smaller than the width of the interconnect lines. As the insulating film, it is possible to use a charge storage film having a charge storage capability provided in the memory transistor extending on the sidewall and top surface of every other interconnect line.

To attain the second object, according to a fourth aspect of the invention, there is provided a method of producing a semiconductor device comprising a plurality of memory transistors arranged in an array and a plurality of word lines serving also as gate electrodes of memory transistors in a same row, arranged extending in a row direction, and repeating in a column direction, an insulating film being formed between the word lines so that the word lines are insulated and isolated from each other, a dimension of the distance between word lines being defined by a thickness of said insulating film, the method of producing a semiconductor device comprising the steps of forming stacked patterns of first charge storage films comprised of a plurality of films and having a charge storage capability and first word lines on a semiconductor in parallel with each other at predetermined distances, forming a second charge storage film comprised of a plurality of films and having a charge storage capability on surfaces of said first word lines and on semiconductor regions exposed between said first word lines, and forming between said first word lines second word lines having at least parts buried between said first word lines where a second charge storage film interposed.

To attain the second object, according to a fifth aspect of the invention, there is provided a method of producing a semiconductor device comprising a plurality of interconnect lines arranged in parallel with each other and having two adjoining interconnect lines isolated by an insulator, comprising the steps of forming a plurality of sacrificial layers in parallel with each other at predetermined intervals, forming sidewall insulating layers of approximately ¼ circular sectional shapes at the two side surfaces of the sacrificial layers, removing the sacrificial layers, depositing a conductive film so as to bury the spaces between the sidewall insulating layers, and grinding the conductive film from the surface so as to form a plurality of interconnect lines isolated by the sidewall insulating layers.

To attain the second object, according to a sixth aspect of the invention, there is provided a method of producing a semiconductor device comprising a plurality of interconnect lines arranged in parallel with each other and having two adjoining interconnect lines isolated by an insulator, comprising the steps of forming a plurality of first interconnect lines in parallel with each other at predetermined intervals, forming sidewall insulating layers at the two side surfaces of the first interconnect lines, depositing a conductive film so as to bury the spaces between the sidewall insulating layers, and grinding the conductive film from the surface so as to form a plurality of second interconnect lines isolated from the first interconnect lines by the sidewall insulating layers between the first interconnect lines.

The methods of production of a semiconductor device according to the fifth and sixth aspects of the invention are for the semiconductor device according to the second aspect of the invention.

To attain the second object, according to a seventh aspect of the invention, there is provided a method of producing a semiconductor device comprising a plurality of memory transistors arranged on a semiconductor in an array and a plurality of word lines serving also as gate electrodes of memory transistors in a same row, extending in a row direction, and repeating in a column direction, two adjoining word lines being isolated by a sidewall insulating layer formed at a side surface of one word line and having an approximately ¼ circular sectional shape and an insulating film formed on a surface of the sidewall insulating layer, the method comprising the steps of forming a plurality of sacrificial layers in parallel with each other at predetermined intervals on the semiconductor, forming sidewall insulating layers on two side surfaces of the sacrificial layers, removing the sacrificial layers, forming a charge storage film including charge storage means inside on the surfaces of the sidewall insulating layers and on regions of the semiconductor exposed between the sidewall insulating layers, depositing a conductive film so as to bury recesses in the surface of the charge storage film, and grinding the conductive film from the surface to form a plurality of word lines isolated by the sidewall insulating layers and the charge storage film.

This method of production is for the semiconductor device of the third aspect of the invention. The insulating film between word lines is made the charge storage film rather than a thermal oxide film.

To attain the second object, according to an eighth aspect of the invention, there is provided a method of producing a semiconductor device comprising a plurality of memory transistors arranged on a semiconductor in an array and a plurality of word lines serving also as gate electrodes of memory transistors in a same row, extending in a row direction, and repeating in a column direction, two adjoining word lines being isolated by a sidewall insulating layer formed at a side surface of one word line and having an approximately ¼ circular sectional shape and an insulating film formed on a surface of the sidewall insulating layer, the method comprising the steps of forming a plurality of multilayer films, each comprising a charge storage film including charge storage means inside and a first conductive film, on the semiconductor in parallel with each other at predetermined intervals, forming sidewall insulating layers on two side surfaces of the multilayer films, again forming a charge storage film including charge storage means inside on the surfaces of the sidewall insulating layers and on regions of the semiconductor exposed between the sidewall insulating layers, depositing a second conductive film so as to bury recesses in the surface of the charge storage film, and grinding the second conductive film from the surface to form a plurality of word lines isolated by the sidewall insulating layers and the charge storage film.

This method of production is for the semiconductor device of the third aspect of the invention. The insulating film between the word lines is made the charge storage film. Further, a thermal oxide film may be formed.

To attain the second object, according to a ninth aspect of the invention, there is provided a method of producing a semiconductor device comprising a plurality of memory transistors arranged on a semiconductor in an array and a plurality of word lines serving also as gate electrodes of memory transistors in a same row, extending in a row direction, and repeating in a column direction, two adjoining word lines being isolated by a sidewall insulating layer formed at a side surface of one word line and having an approximately ¼ circular sectional shape and an insulating film formed on a surface of the sidewall insulating layer, the method comprising the steps of forming a charge storage film including charge storage means inside on the semiconductor, forming a plurality of conductive layers comprising first conductive films in parallel with each other at predetermined intervals on the charge storage film, forming sidewall insulating layers on two side surfaces of a plurality of conductive layers, removing portions of the charge storage film between the sidewall insulating layers by etching using the conductive layers and the sidewall insulating layers as masks, again forming a charge storage film including charge storage means inside on the surfaces of the conductive layers, on the surfaces of the sidewall insulating layers, and on regions of the semiconductor exposed between the sidewall insulating layers, depositing a second conductive film so as to bury recesses in the surface of the charge storage film formed again, and grinding the second conductive film from the surface to form a plurality of word lines isolated by the sidewall insulating layers and the charge storage film.

This method of production is for the semiconductor device of the third aspect of the invention. The insulating film between word lines is made the charge storage film. Further, a thermal oxide film may be formed. In the ninth aspect of the invention, etching damage is harder to occur at the semiconductor surface at the time of processing the conductive layer and sidewalls compared with the method of producing of the eighth aspect of the invention.

In the methods of production of a semiconductor device according to the fourth to ninth aspects of the invention explained above, a high density word line arrangement is realized by just repeating two times an operation of stacking and patterning a charge storage film and word line material.

BRIEF DESCRIPTION OF THE DRAWINGS

These and other objects and features of the present invention will become clearer from the following description of the preferred embodiments given with reference to the attached drawings, wherein:

FIG. 20 is a plan view of the pattern of word lines of a nonvolatile memory device in the case of using a second method of preventing leakage according to the fifth embodiment;

FIG. 21 is a view of the configuration of a nonvolatile memory device using a third method of preventing leakage according to the fifth embodiment;

FIGS. 23A and 23B are a plan view and a sectional view along the line A—A of the state after formation of a sacrificial layer in the production of the semiconductor device according to the sixth embodiment;

FIG. 24 is a sectional view of the state after deposition of a dielectric in the production of the semiconductor device according to the sixth embodiment;

FIGS. 45A and 45B are a plan view and a sectional view along the line A—A of the state after removal of a sacrificial layer in the production of the semiconductor device according to the ninth embodiment;

FIG. 46 is a sectional view of the state after deposition of a conductive film in the production of the semiconductor device according to the ninth embodiment;

DESCRIPTION OF THE PREFERRED EMBODIMENTS

Preferred embodiments of the present invention will be described in detail below while referring to the attached figures.

FIRST EMBODIMENT

The first embodiment relates to the first aspect of the present invention, that is, relates to a nonvolatile memory device having a virtual ground (VG) type memory cell array.

Figure 1A:
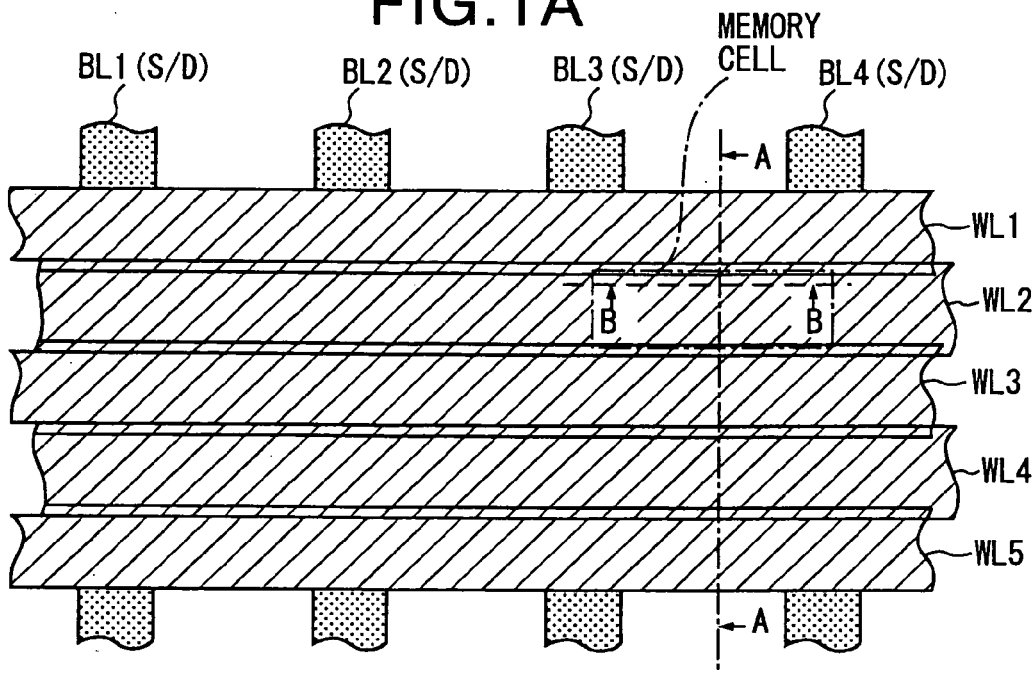
FIGS. 1A to 1C are a plan view and sectional views of the configuration of a semiconductor memory device having a virtual ground type memory cell array according to a first embodiment of the present invention.
Figure 1B:
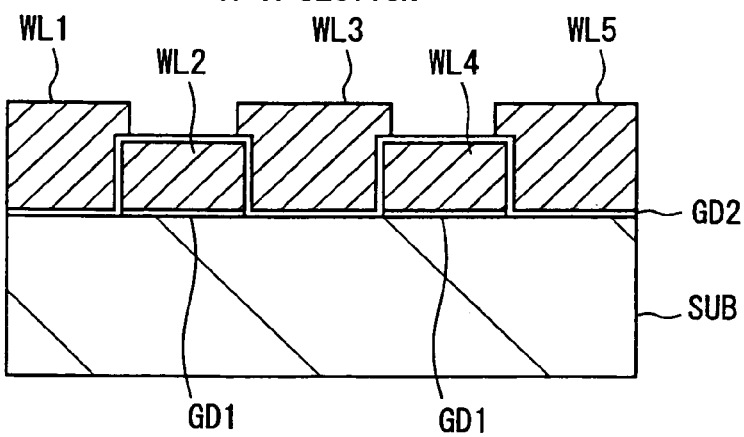

FIG. 1A is a plan view of a VG type memory cell array using the present invention to reduce the distance between word lines. Further, FIG. 1B is a sectional view along the line A—A of FIG. 1A, while FIG. 1C is a sectional view along the line B—B of FIG. 1A.

Figure 1C:
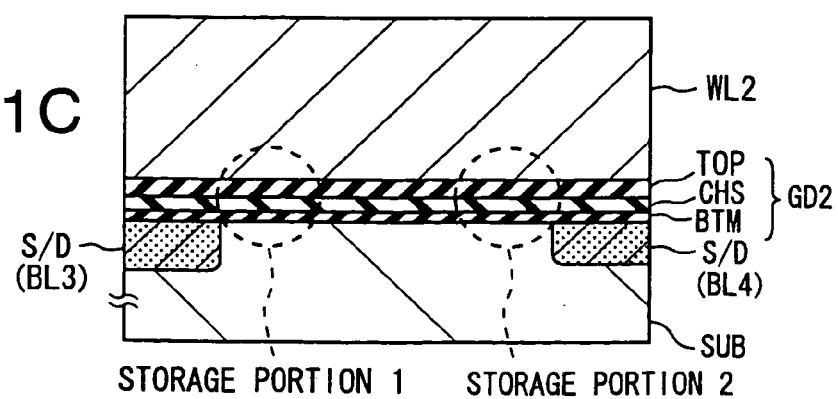

As shown in FIG. 1C, the surface of a P-type semiconductor substrate SUB is formed with source-drain regions S/D comprising N-type impurity regions separated from each other. The source-drain regions S/D, as shown in FIG. 1A, form bit lines BL1, BL2, BL3, BL4 . . . and has a pattern of lines extending in the column direction arranged in parallel stripes shown in a whole cell array.

The substrate regions sandwiched between the source-drain regions S/D are called "channel formation regions". These channel formation regions end up forming parallel stripes extending in the column direction.

Word lines WL1, WL2, WL3, WL4, WL5 . . . are arranged extending in the row direction perpendicularly intersecting the channel formation regions and source-drain regions S/D. As shown in FIG. 1B, the sectional shapes of the even numbered word lines WL2, WL4 . . . and odd numbered word lines WL1, WL3, WL5 . . . differ somewhat. In the present embodiment, the even numbered word lines WL2, WL4 . . . are formed on the semiconductor substrate SUB in the state with the charge storage film GD1 interposed. In the present embodiment, the even numbered word lines become the "first word lines". Further, the charge storage film GD1 corresponds to the "first charge storage film" in the present invention.

A charge storage film GD2 is formed covering the surfaces of the first word lines WL2, WL4 . . . and the surfaces of the substrate regions exposed between the first word lines. Further, the odd numbered word lines WL1, WL3, WL5 . . . are formed between the first word lines in the state with the charge storage film GD2 interposed. In the present embodiment, the odd numbered word lines WL1, WL3, WL5 . . . become the "second word lines". The word lines as a whole comprise the second word lines and the first word lines arranged alternately. Further, the charge storage film GD2 corresponds to the "second charge storage film" in the present invention.

Explaining the relationship between the first and second word lines in more detail, the bottom surfaces of the second word lines face the semiconductor regions between the first word lines in the state with the charge storage film GD2 interposed. Almost all portions of the sides of the second word lines face the sides of the first word lines in the state with the charge storage film GD2 interposed. Further, the two ends of each of the second word lines in the width direction ride up over the ends of the adjoining two first word lines in the width direction in the state with the charge storage film GD2 interposed.

In this way, the word lines in the present embodiment are insulated and isolated by the interposed charge storage film GD2 so that the space between each two adjoining word lines becomes the film thickness in the separation direction. Note that the word lines are comprised of doped polycrystalline silicon or doped amorphous silicon.

In the present embodiment, MONOS type memory transistors are shown as examples, so the charge storage films GD1 and GD2 are each so-called "ONO types" comprising three layers.

Specifically, each of the charge storage films GD1 and GD2 comprises a bottommost layer of a first potential barrier film BTM, a middle layer of a charge trap film CHS, and a topmost layer of a second potential barrier film TOP. The first potential barrier film BTM comprises, for example, a thermal-oxidized silicon film obtained by thermally oxidizing the substrate surface to form a silicon oxide film or an oxynitride film obtained by nitriding the thermal-oxidized silicon film. The charge trap film CHS comprises for example silicon nitride or silicon oxynitride and includes a large number of charge traps inside it as dispersed charge storing means. The second potential barrier film TOP is comprised of for example a silicon oxide film.

Note that in the case of a so-called MNOS type, the second potential barrier film TOP is omitted, and the charge trap film CHS is formed relatively thick. Further, in the case of a so-called nanocrystal type, innumerable microparticles comprised of for example polycrystalline silicon are buried discretely between the first potential barrier film and oxide film.

The potential barrier films GD1 and GD2 have a total thickness, converted to silicon dioxide, of about 10 odd nm.

The potential barrier films GD1 and GD2 are formed so that the film structure including the film thickness becomes equal in portions contiguous with the monocrystalline silicon (semiconductor substrate SUB). The portions contiguous with the polycrystalline silicon or amorphous silicon of the potential barrier film GD2 (first word lines WL2, WL4 . . . ) however become thicker than the portions contiguous with the monocrystalline silicon when converted to silicon dioxide. This is because the thermal oxidation rate of the polycrystalline silicon or amorphous silicon becomes about two times the thermal oxidation rate of the monocrystalline silicon. Therefore, the insulation characteristics between the word lines are secured at a level not posing a problem.

At the time of writing data, when injecting charges into the storage portion 1 shown in FIG. 1C, a positive drain voltage is supplied to the bit line BL3 and a reference voltage to the bit line BL4, while a predetermined positive voltage is supplied to the word line WL2. At this time, the electrons supplied from the source-drain region S/D forming the bit line BL4 are accelerated in the channel, whereby a high energy is obtained at the bit line BL3 side. The potential barrier of the first potential barrier film BTM is exceeded, whereby the charge is injected into and stored at the storage portion 1.

When injecting a charge into the storage portion 2, the voltage is switched between the bit lines BL3 and BL4. Due to this, the electron donor side and the side where the electrons become "hot" energy wise become opposite to the above case, whereby the electrons are injected into the storage portion 2.

When reading data, a predetermined read drain voltage is supplied between the bit lines BL3 and BL4 so that the storage portion where the bit data to be read was written becomes the source. Further, an optimized positive voltage able to turn on the channel portion sandwiched between the storage portions of the two sides, but low enough not to change the threshold voltages of the storage portions at the two ends of the memory transistor is supplied to the word line WL2. At this time, the conductivity of the channel is effectively changed due to the amount of charge stored in the storage portion to be read or the presence or absence of a charge. As a result, the stored information is read out converted to an amount of current or a potential difference of the drain side.

When reading the other bit data, the bit line voltage is changed so that the storage portion where that bit data has been written becomes the source, whereby the data is read out in the same way as above.

When erasing data, an erase voltage of a direction opposite to that at the time of writing the data is supplied so that the channel formation region and source-drain region S/D side becomes high and the word line WL2 side becomes low. Due to this, the stored charge is drained from one or both of the storage portions to the substrate SUB side, and the memory transistor returns to the erased state. Note that as another erasing method, it is also possible to adopt the method of injecting into the storage portion, by attracting it by the electric field of the control gate, the high energy charge occurring at the source-drain region S/D side or near a not shown PN junction inside of the substrate, having a polarity opposite to the stored charge, and caused by band-to-band tunneling.

The procedure for formation of a VG type memory cell array will be explained next while referring to the drawings. This procedure for formation relates to the fourth aspect of the present invention.

Figure 2A:
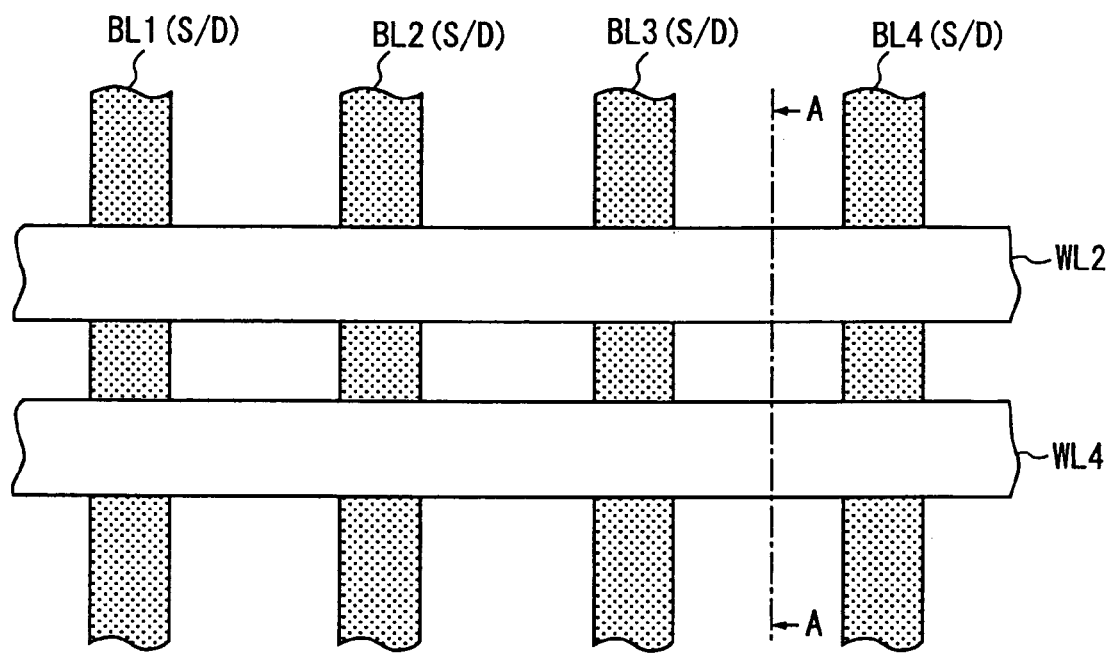
FIGS. 2A and 2B are sectional views of the state after formation of first word lines in the production of the semiconductor memory device according to the first embodiment.
Figure 2B:
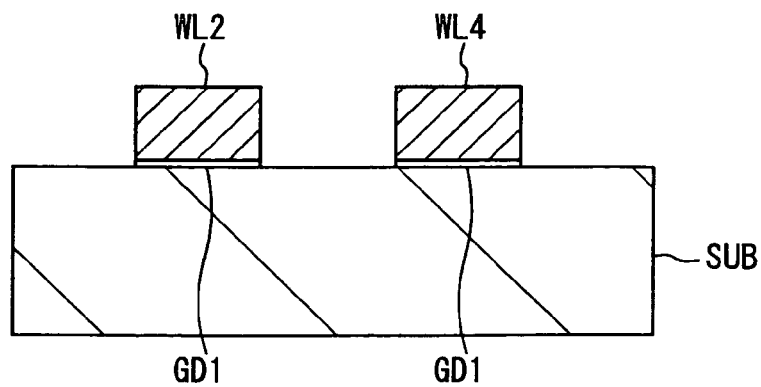
Figure 3:
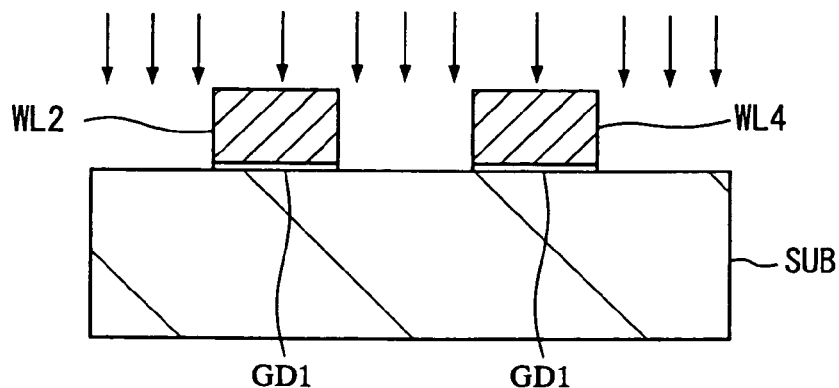
FIG. 3 is a sectional view of the state when etching a substrate in the production of the semiconductor memory device according to the first embodiment.
Figure 4:
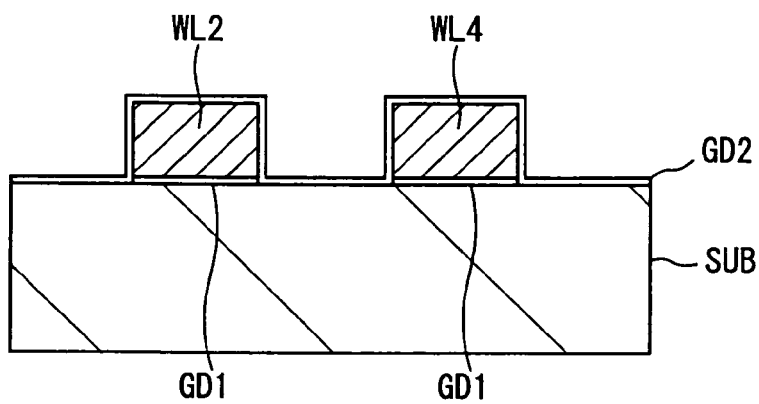
FIG. 4 is a sectional view of the state after forming a second charge storage film in the production of the semiconductor memory device according to the first embodiment.
Figure 5:
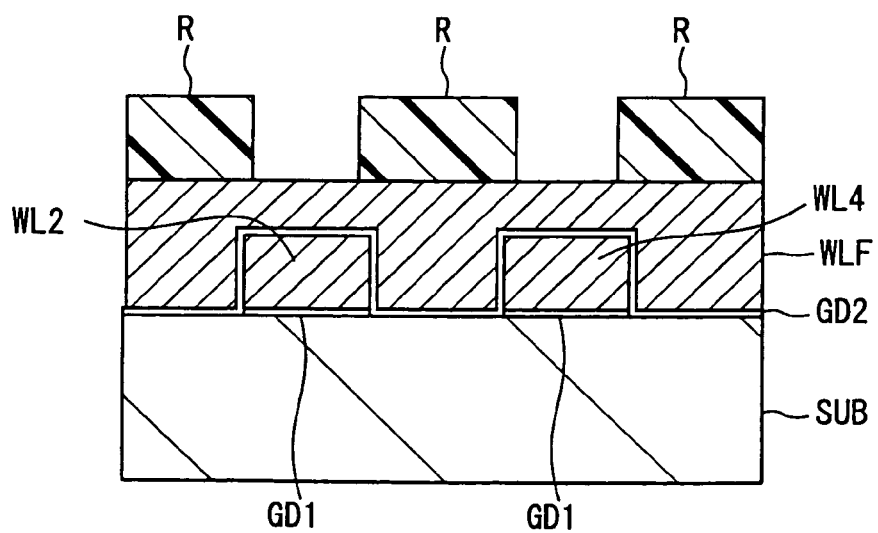
FIG. 5 is a sectional view of the state after formation of a resist pattern for a processing mask of second word lines in the production of the semiconductor memory device according to the first embodiment.

FIGS. 2A and 2B to FIG. 5 are sectional views (and plan views) of steps in the formation of word lines. FIG. 2A is a plan view, while FIG. 2B is a sectional view along the line A—A of FIG. 2A. FIG. 3. to FIG. 5 are all sectional views along the line A—A.

The semiconductor substrate SUB is formed with wells and injected with ions for adjusting the threshold voltage in accordance with need. Further, a resist or other mask layer is formed on the semiconductor substrate and ions injected, then activate the substrate to form source-drain regions S/D (bit lines BL1, BL2, BL3, BL4 . . . )

The semiconductor substrate SUB is formed with a first charge storage film for forming the charge storage film GD1. For example, the surface of the semiconductor substrate SUB is thermally oxidized to form the first potential barrier film BTM and the first potential barrier film BTM is nitrided in accordance with need and form a charge trap film CHS comprised of silicon nitride or silicon oxynitride on the first potential barrier film BTM, then the surface of the charge trap film CHS is thermally oxidized or otherwise treated used to form the second potential barrier film TOP.

The first charge storage film GD1 has deposited on it a conductive film comprised of doped polycrystalline silicon or doped amorphous silicon by for example chemical vapor deposition (CVD).

The conductive film is formed with a resist pattern, then is anistropically etched by reactive ion etching (RIE) etc. to pattern the conductive film. Next, the parts of the first charge storage film exposed between the conductive film patterns are patterned by a dry etching system using for example $CF_4/CHF_3/Ar$. Next, the resist patterns are removed. Due to this, multilayer patterns comprising the charge storage film GD1 and first word lines WL2 or WL4 are formed in parallel stripe patterns perpendicularly intersecting the source-drain regions S/D as shown in FIG. 2A.

As shown in FIG. 3, the surface layer of the semiconductor substrate SUB is etched. This etching may be performed by ordinary dry etching, but a method using sacrificial oxidation is preferable. That is, the surface of the substrate is thermally oxidized to form a thin sacrificial oxide film, then this is removed by wet etching etc. Due to this, the surface layer of silicon consumed at the time of sacrificial oxidation is etched uniformly without leaving damage. The conditions for this sacrificial oxidation are determined in advance in accordance with the conditions for formation of the first charge storage film (charge storage film GD1) so that the nitrogen atoms introduced into the substrate surface layer are sufficiently removed.

As shown in FIG. 4, the second charge storage film is formed under the same conditions as the first charge storage film. Due to this, the second charge storage film (charge storage film GD2) is formed.

As shown in FIG. 5, a conductive film WLF completely burying the first word lines WL2, WL4, . . . , for example, a film of doped polycrystalline silicon or doped amorphous silicon, is deposited.

On this conductive film WLF are formed resist patterns R opening above the first word lines WL2, WL4, . . .

Next, the resist patterns R are used as a mask for RIE or other anistropic etching. Due to this, the conductive film WLF is etched into isolated sections and the second word lines WL1, WL3, WL5, . . . shown in FIG. 1B are formed.

SECOND EMBODIMENT

The second embodiment relates to the first aspect of the present invention and relates to a nonvolatile memory device having a NAND type memory cell array.

Figure 6:
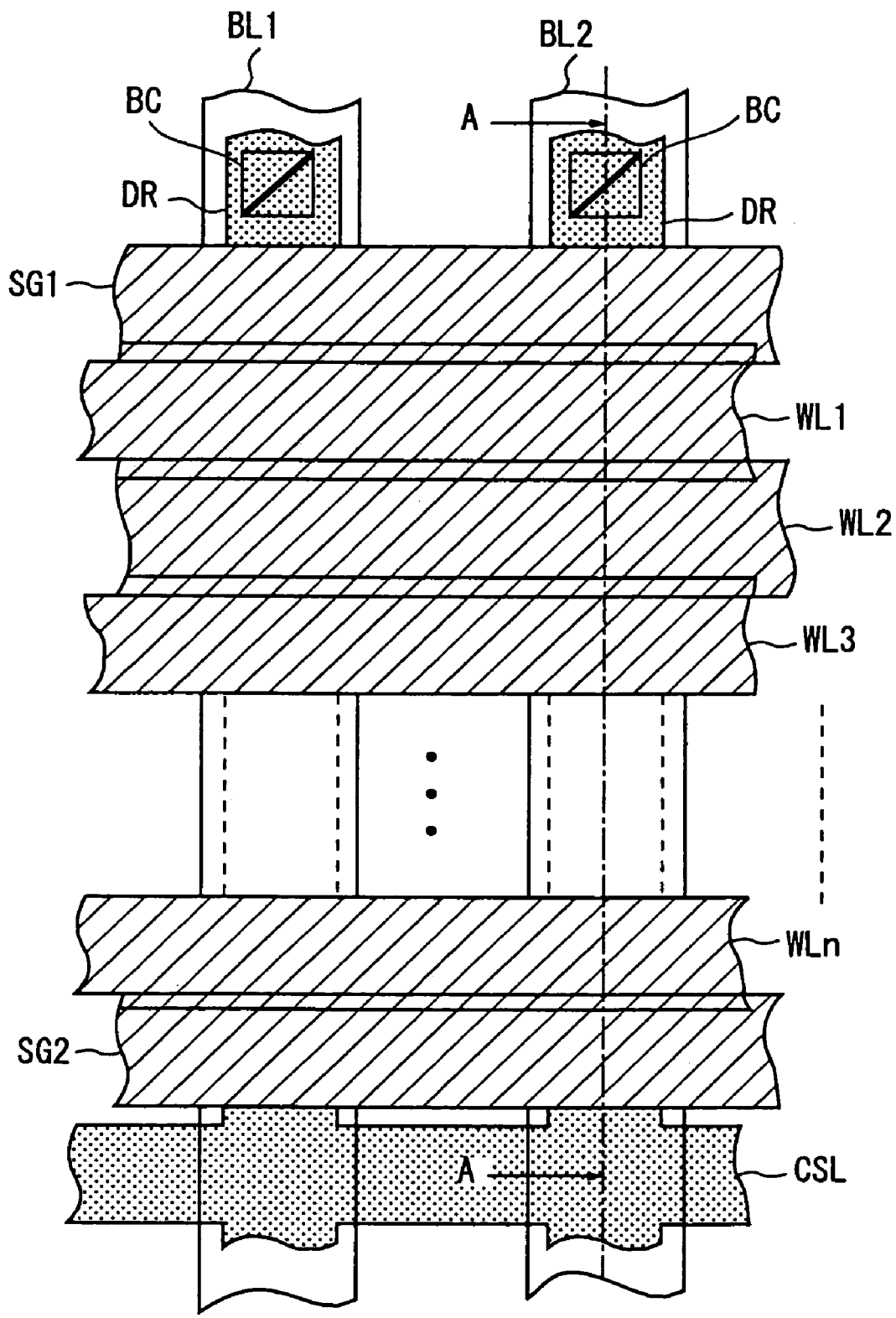
FIG. 6 is a plan view of the configuration of a semiconductor memory device having a NAND type memory cell array according to a second embodiment of the present invention.

FIG. 6 is a plan view of a NAND type memory cell array using the present invention to reduce the distance between word lines. Further, FIG. 7A is a sectional view along the line A—A of FIG. 6, while FIG. 7B is a sectional view enlarging part of FIG. 7A.

Figures 7A, 7B:
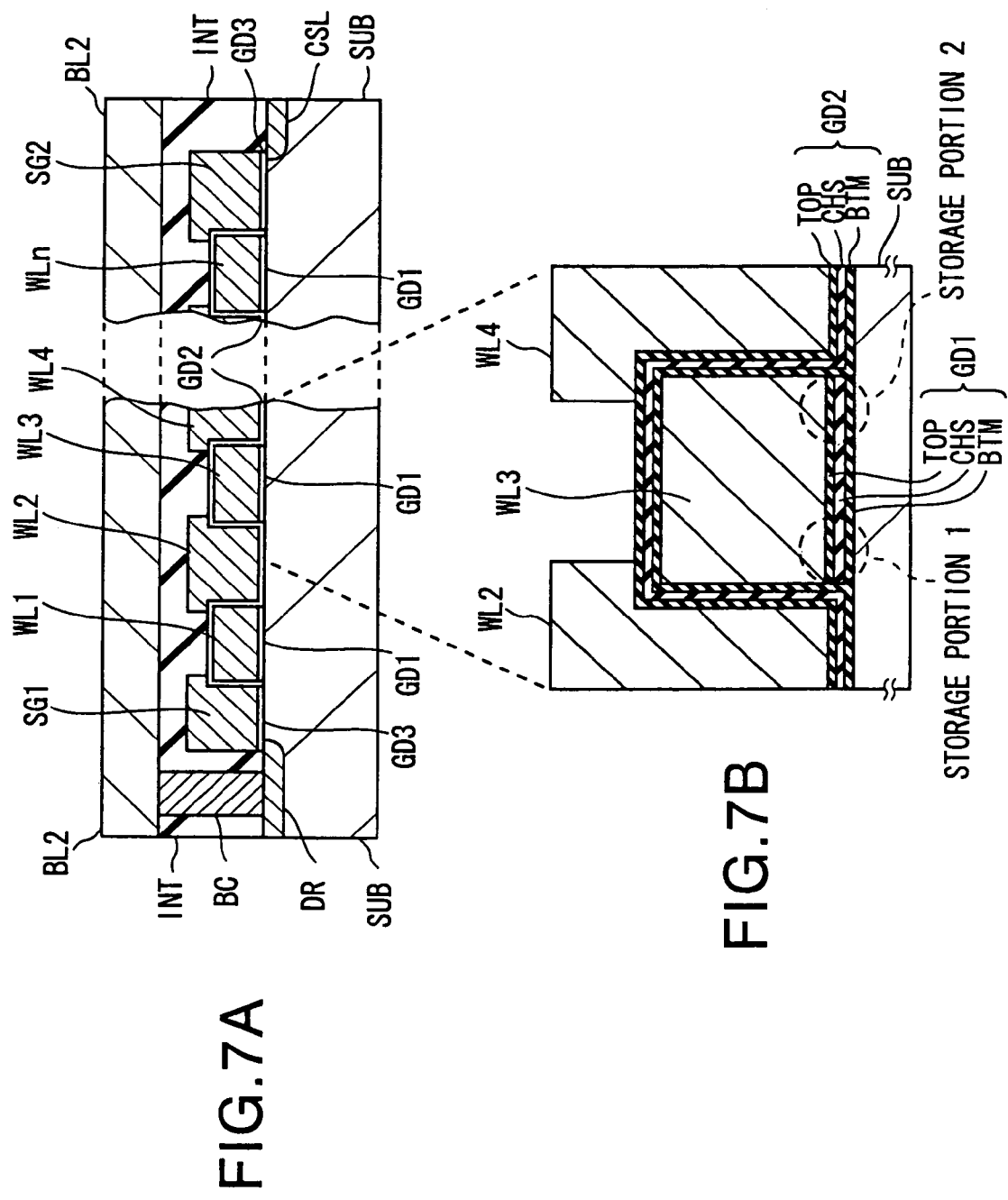
FIGS. 7A and 7B are a sectional view and enlarged view of the configuration of a semiconductor memory device having a NAND type memory cell array according to the second embodiment of the present invention.

As shown in FIG. 7A and FIG. 7B, a P-type semiconductor substrate SUB is formed with word lines WL1, WL2, . . . WLn of substantially the same sectional structures as in the first embodiment. That is, the odd numbered word lines WL1, WL3, . . . , WLn (first word lines) are formed on the semiconductor substrate SUB where a charge storage film GD1 interposed. A charge storage film GD2 is formed covering the surfaces of the first word lines WL1, WL3, . . . . , WLn and the surfaces of the substrate regions exposed between the first word lines. Further, even numbered word lines WL2, WL4, . . . (second word lines) are formed between the first word lines in the state with the charge storage film GD2 interposed. More particularly, the bottom surfaces of the second word lines face the semiconductor regions between the first word lines in the state with the charge storage film GD2 interposed. The main sides of the second word lines face the sides of the adjoining first word lines in the state with the charge storage film GD2 interposed. Further, the two ends of the second word lines in the width direction ride up over the ends of the adjoining two first word lines in the width direction in the state with the charge storage film GD2 interposed.

In this way, the word lines in the present embodiment are insulated and isolated by the interposed charge storage film GD2 so that the space between each two adjoining word lines in the separation direction becomes the film thickness. Note that the word lines are comprised of doped polycrystalline silicon or doped amorphous silicon.

The charge storage films GS1 and GD2 comprise, for example in the case of a MONOS type memory transistor, a bottommost layer of a first potential barrier film BTM, a middle layer of a charge trap film CHS, and a topmost layer of a second potential barrier film TOP in the same way as in the first embodiment.

At the outside of the word line WL1 a control gate line SG1 isolated by for example the charge storage film GD2 is arranged in parallel. Similarly, at the outside of the word line WLn a control gate line SG2 isolated by for example the charge storage film GD2 is arranged in parallel. These control gate lines SG1 and SG2 serve also as gate electrodes of select transistors and are faced to the semiconductor substrate SUB with a gate isolation film GD3 interposed. The gate isolation film GD3 is comprised for example of a single layer of a silicon dioxide film. In this case, the production process becomes somewhat complicated, but the single layer of the gate isolation film is formed only at those portions and the select transistors become ordinary MOS types. Alternatively, the charge storage films GD2 and gate isolation film GD3 are made the same films and a charge is prevented from being injected into the portions of the gate isolation film GD3 by the applied bias conditions.

At the outside of the control gate line SG1 is formed a drain region DR comprised of an N-type impurity region. This drain region DR is shared with a not shown other NAND string.

Further, at the outside of the control gate line SG2, a common source line CSL comprised of an N-type impurity region is formed. The common source line CSL is shared with one row's worth of the NAND string in the row direction and a not shown other row's worth of the NAND string adjoining it in the column direction.

The transistors forming these NAND strings have formed on them an interlayer insulating film INT. The interlayer insulating film INT has bit lines BL1 and BL2 arranged on it in parallel stripes. The bit lines are connected to the corresponding drain regions DR by bit contacts BC formed at the interlayer insulating film INT.

When writing data, if injecting charges into the storage portion 1 shown in FIG. 7B, a positive drain voltage is supplied to the bit line BL2, a reference voltage is supplied to the common source line CSL, and a voltage for turning on two select transistors is supplied to the control gate lines SG1 and SG2. The word lines WL1, WL2, WL4 ... WLn other than the word line WL3 to which the cell to be written on is connected are supplied with a pass voltage enabling transmission of the above drain voltage or above reference voltage to the cell to be written on. Due to this, a predetermined write drain voltage is supplied between the source and drain of the memory transistor forming the cell to be written in. In this state, a predetermined program voltage is supplied to the word line WL3. At this time, the electrons supplied from the source side to the channel in FIG. 7B are accelerated in the channel, a high energy is obtained at the drain side end of the channel, the potential barrier of the first potential barrier film BTM is exceeded, and the charge is injected and stored in the storage portion 1.

When injecting a charge in the storage portion 2, the voltage is switched between the bit line BL2 and the common source line CSL. Due to this, the electron supply side and the side where the electrons become hot energywise become opposite to the above case and electrons are injected into the storage portion 2.

As a still more preferable method of writing data, it is possible to use source side injection. In this case, when writing data into the storage portion 1, a reference voltage is supplied to the bit line BL2, while a drain voltage is supplied from the common source line. Further, the voltage supplied to the word line WL2 more close to the source by one from the word line WL3 to which the cell to be written on is connected is not a simple pass voltage, but a voltage optimized to enable source side injection. Due to this, the lateral direction electric field becomes strong near the boundary between the word line WL2 and word line WL3 and electrons can be injected more efficiently to the source end (storage portion 1) of the memory transistor.

When injecting a charge in the storage portion 2, the voltage between the bit line BL2 and the common source line CSL is switched and the voltage of the word line 4 is optimized to a value enabling source side injection. Due to this, the electron supplying side and side where the electrons become hot energy-wise become opposite to the above case and electrons are injected into the storage portion 2.

When reading data, a predetermined read drain voltage is supplied between the bit line BL2 and the common source line CSL so that the storage portion where the bit to be read is written becomes the source, while a pass voltage is supplied to the word lines other than the word to which the cell to be read is connected. Further, an optimized positive voltage able to turn on the channel portion sandwiched between the storage portions of the two sides, but low enough not to change the threshold voltages of the storage portions at the two ends of the memory transistor is supplied to the word line WL3. At this time, the conductivity of the channel is effectively changed due to the amount of charge stored in the storage portion to be read or the presence or absence of a charge. As a result, the stored information is read out converted to an amount of current or a potential difference of the drain side.

When reading the other bit data, the voltage between the bit line BL2 and the common source line CLS is changed so that the storage portion where that bit data has been written becomes the source, whereby the data is read out in the same way as above.

When erasing data, either the charge is drained to the substrate side using FN tunneling over the entire channel or the charge is drained to the word line side for block erasure.

Figure 8A:
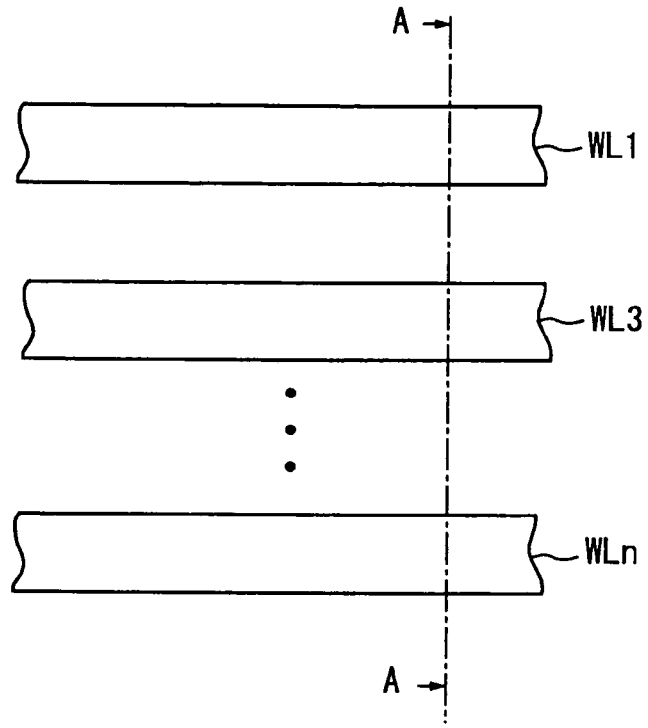
FIGS. 8A and 8B are sectional views of the state after formation of first word lines in the production of the semiconductor memory device according to the second embodiment.
Figure 8B:
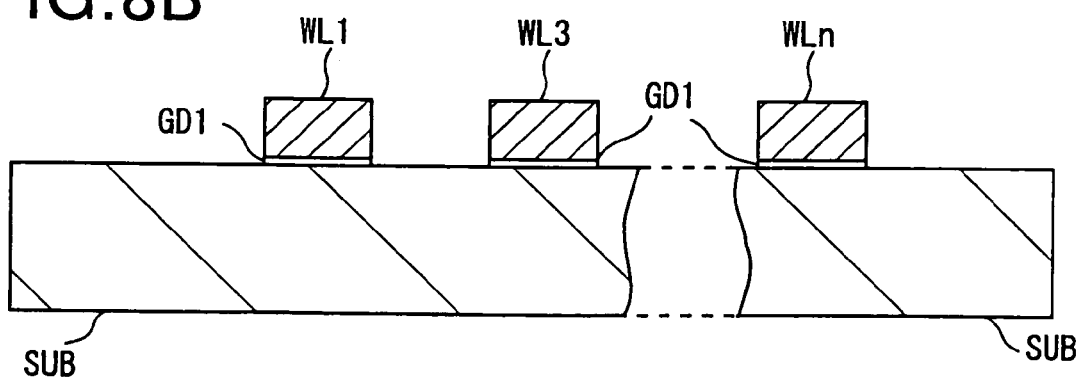
Figure 9:
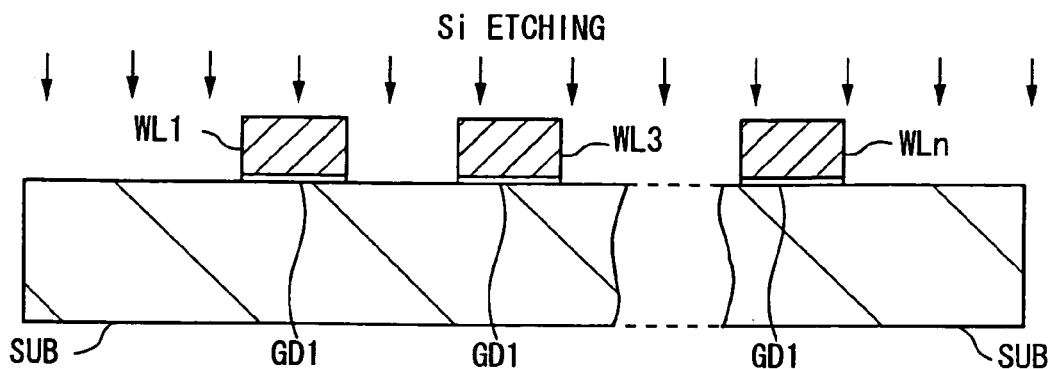
FIG. 9 is a sectional view of the state when etching a substrate in the production of the semiconductor memory device according to the second embodiment.
Figure 10:
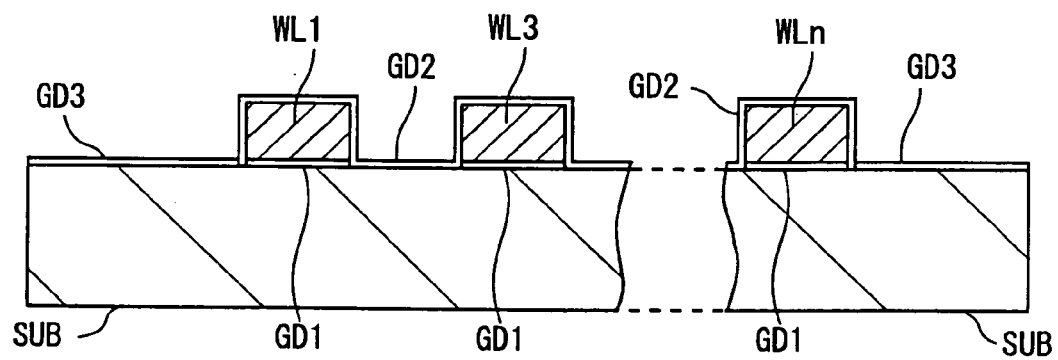
FIG. 10 is a sectional view of the state after formation of a second charge storage film in the production of the semiconductor memory device according to the second embodiment.
Figure 11:
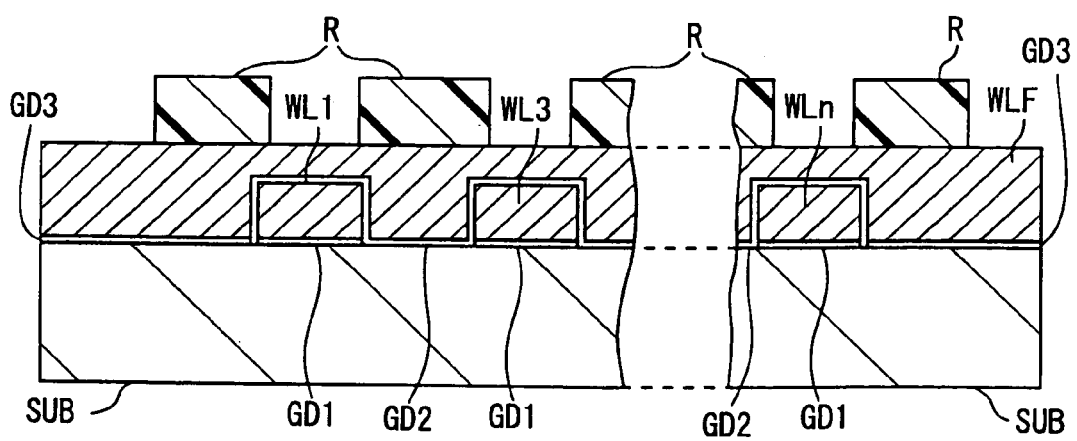
FIG. 11 is a sectional view of the state after formation of a resist pattern for a processing mask for second word lines in the production of the semiconductor memory device according to the second embodiment.

The procedure for formation of a NAND type memory cell array will be explained next while referring to the drawings. FIG. 8A is a plan view, while FIG. 8B is a sectional view along the line A—A of FIG. 8A. FIG. 9 to FIG. 11 are all sectional views along the line A—A.

The semiconductor substrate SUB is formed with wells and injected with ions for adjusting the threshold voltage in accordance with need.

The semiconductor substrate SUB is formed with a first charge storage film GD1. For example, the surface of the semiconductor substrate SUB is thermally oxidized to form the first potential barrier film BTM, then the first potential barrier film BTM is nitrided in accordance with need, and form a charge trap film CHS comprised of silicon nitride or silicon oxynitride on the first potential barrier film BTM, then the surface of the charge trap film CHS is thermally oxidized or otherwise treated used to form the second potential barrier film TOP.

The first charge storage film GD1 has deposited on it a conductive film comprised of doped polycrystalline silicon or doped amorphous silicon by for example CVD.

The conductive film is formed with resist patterns, then is anistropically etched by RIE etc. to pattern the conductive film. Next, the parts of the first charge storage film exposed between the conductive film patterns are patterned by a dry etching system using for example $CF_4/CHF_3/Ar$. Next, the resist patterns are removed. Due to this, multilayer patterns comprising the charge storage film GD1 and first word lines WL1, WL3, ... WLn are formed in parallel stripe patterns as shown in FIG. 8A.

As shown in FIG. 9, the surface layer of the semiconductor substrate SUB is etched. This etching may be performed by ordinary dry etching, but a method using sacrificial oxidation is preferable. That is, the surface of the substrate is thermally oxidized to form a thin sacrificial oxide film, then this is removed by wet etching etc. Due to this, the surface layer of silicon consumed at the time of sacrificial oxidation is etched uniformly without leaving damage. The conditions for this sacrificial oxidation are determined in advance in accordance with the conditions for formation of the first charge storage film GD1 so that the nitrogen atoms introduced into the substrate surface layer are sufficiently removed.

As shown in FIG. 10, the second charge storage film is formed under the same conditions as the first charge storage film. Due to this, the second charge storage film GD2 is formed. In accordance with need, the charge storage film GD2 of the region outward from the word line WL1 and the region outward from the word line WLn is selectively removed to selectively form a single layer of an insulating film GD3 at those portions.

As shown in FIG. 11, a conductive film WLF completely burying the first word lines WL1, WL3, ... , WLn, for example, a film of doped polycrystalline silicon or doped amorphous silicon, is deposited.

On this conductive film WLF are formed resist patterns R opening above the first word lines WL1, WL3, ... , WLn.

Next, the resist patterns R are used as a mask for RIE or other anistropic etching. Due to this, the conductive film WLF is etched into isolated sections and the second word lines WL2, WL4, ... shown in FIG. 7B are formed.

The semiconductor substrate regions outward from the selection gate lines SG1 and SG2 are injected with ions of N-type impurities. At this time, since the ions do not pass through the regions where the word lines are arranged, source-drain regions are not formed.

Next, the interlayer insulating film INT is deposited, bit contacts BC are formed, and bit lines are formed to complete the NAND type nonvolatile memory device.

Note that in the above first embodiment and second embodiment, the second word lines to be formed later may be formed so as to bury the spaces between the first word lines and not overlap with the lines. In this case, it is preferable to form a stopper film for preventing chemical mechanical polishing (CMP) or other polishing on the first word lines. Further, in a structure not allowing overlap, it is possible to optimize the ion injection conditions in the NAND type so as to cause the ions to pass through the space between word lines (charge storage film GD2) and form narrow source-drain impurity regions S/D in the word line direction.

In the semiconductor memory devices according to the above first embodiment and second embodiment, since the distance between word lines is determined by the thickness of the multilayer film (charge storage film GD2), the distance between word lines is much smaller than the width of the word lines. Therefore, it is possible to realize $2F^2$ (F: resolution limit of lithography or design rule) and a memory cell with an extremely small area as a cell for storing 2-bit data.

Further, with the method of producing a semiconductor memory device according to the above embodiments, a high density word line arrangement is realized just by repeating twice the operation of stacking a charge storage film and word line material and patterning the same.

Further, since the substrate is etched thin before forming the second charge storage film, the precision of formation of the second charge storage film is improved.

Here, the inventors prepared a wafer A processed by rapid thermal nitridation (RTN) when forming the first charge storage film and a wafer B not processed by RTN and thermally oxidized them assuming formation of the first potential barrier film of the second charge storage film.

Figure 12:
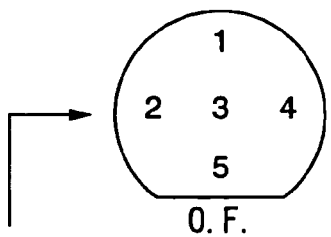
FIG. 12 is a graph of the results of measurement when investigating variations in thickness of a thermal oxide film due to rapid thermal nitridation so as to explain the need for etching the substrate in the production of the semiconductor memory device according to the first and second embodiments of the present invention.

The table of FIG. 12 shows the measured values of the oxide film. Here, to accurately measure the film thickness, the surface was thermally oxidized long with the aim of 18 nm. The thickness of the thermal oxide film was measured at five measurement points in the wafer.

As a result, it was learned that with thermal oxidation of the wafer A processed by RTN, the oxidation rate is low and the variation in the thickness of the oxide film is larger than the wafer B. This is because nitrogen is introduced into the substrate at the time of RTN and this nitrogen obstructs the oxidation.

In the above embodiment of the present invention, before the formation of the second charge storage film, the surface of the substrate was oxidized to form a sacrificial oxide film, then this oxide film was etched to remove the nitrogen-containing surface layer of the substrate. Due to this, the second charge storage film can be formed with a good precision and variation of characteristics can be suppressed.

THIRD EMBODIMENT

The third embodiment relates to a partial change of the steps of the first and second embodiments.

At the step of FIG. 2B of the first embodiment or the step of FIG. 8B of the second embodiment explained above, the conductive film pattern and the first charge storage film are continuously dry etched to form patterns comprising the first charge storage film GD1 and first word lines WL2 or WL4. With dry etching, however, the substrate is damaged somewhat. This is therefore not that preferable.

Here, the method was considered of dry etching only the conductive film patterns and removing the first charge storage film for forming the first charge storage film GD1 by wet etching.

When the first charge storage film is an ONO film, there is silicon nitride. This cannot be removed by a silicon oxide etchant comprised mainly of fluoric acid. Processing using hot phosphoric acid becomes necessary. In processing by hot phosphoric acid, however, the new problem arises of the high concentration polycrystalline silicon surface ending up being etched.

The third embodiment provides a method of production suitable for removing this first charge storage film by wet etching.

Figure 13:
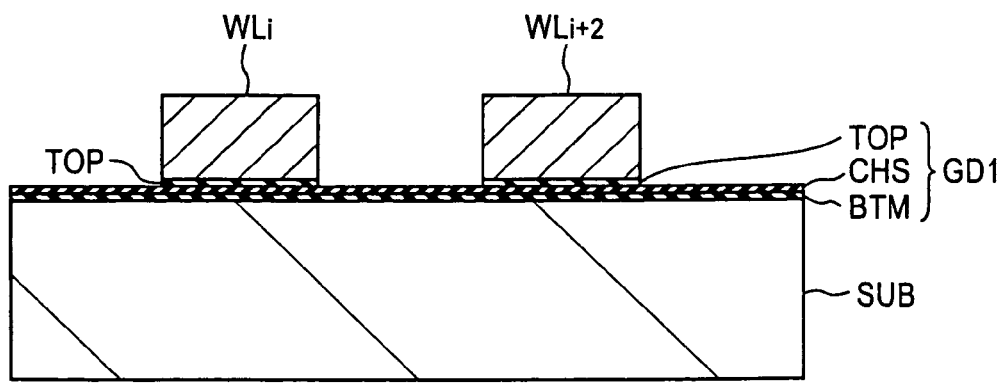
FIG. 13 is a sectional view of the state after patterning the first word lines in the production of a nonvolatile memory device according to a third embodiment.
Figure 14:
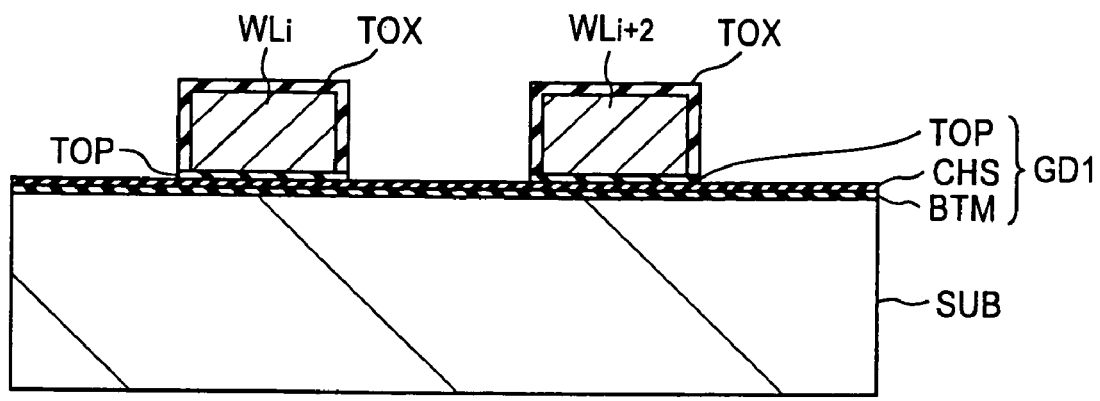
FIG. 14 is a sectional view of the state after formation of a thermal oxide film in the production of the nonvolatile memory device according to the third embodiment.
Figure 15:
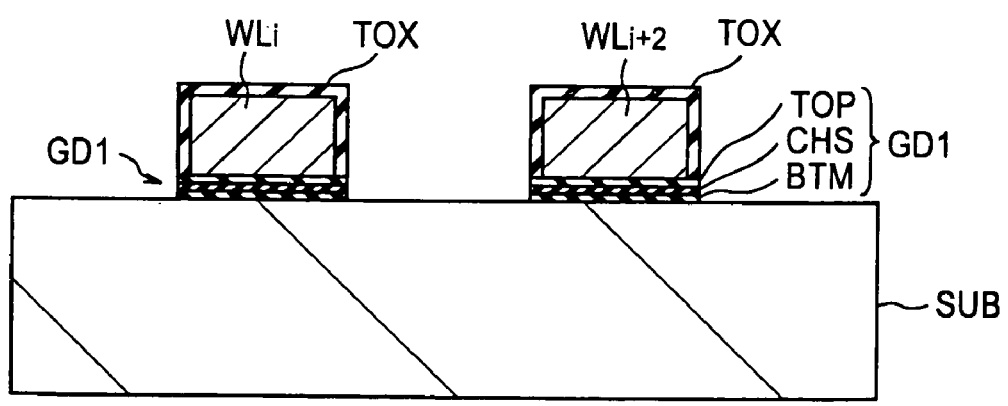
FIG. 15 is a sectional view of the state after formation of a thermal oxide film in the production of the nonvolatile memory device according to the third embodiment.

The method shown in this embodiment can be applied to all types, not only the VG type or NAND type, so the explanation will be given here using FIG. 13 to FIG. 15 showing sections along the line A—A.

FIG. 13 is a sectional view at the time of patterning the conductive material on the ONO structure first charge storage film GD1 to form the first word lines WLi, WLi+2, . . . and corresponds to FIG. 2B and FIG. 8B.

When the dry etching of the conductive material ends, parts of the second potential barrier film TOP are sometimes shaved off depending on the amount of over etching. In some cases, as illustrated, the second potential barrier film TOP is removed around the first word lines.

In this embodiment, at this time, the surfaces of the first word lines WLi, WLi+2, . . . are thermally oxidized to form, as shown in FIG. 14, a thermal oxide film TOX of about 10 nm on the surface of the first word lines.

Further, the portions of the first charge storage film GD1 exposed between the first word lines are removed by wet etching in the state with the surfaces of the first word lines protected by the thermal oxide film TOX. That is, the silicon nitride film (charge trap film CHS) is removed by an etchant using hot phosphoric acid and the silicon dioxide film (first potential barrier film BTM) is removed by an etchant mainly comprised of fluoric acid.

At the time of etching, naturally the thermal oxide film TOX also becomes thinner. In this embodiment, the thickness of the thermal oxide film TOX may also be set in advance so that the thermal oxide film is etched off at the time of the end of this etching. Alternatively, as shown in FIG. 15, the film may be made thicker to a certain extent so that the thermal oxide film TOX remains.

Whatever the case, there is the advantage that the amount of the first word lines shaved off is reduced compared with the case where the thermal oxide film is not formed.

Next, in the same way as the first and second embodiments, the second charge storage film GD2 is formed, the spaces between the first word lines are buried with a conductive material, then this is patterned to form the second word lines WLi−1, WLi+1, . . .

Note that when leaving the thermal oxide film TOX to the end, the insulation characteristics between the word lines are remarkably improved at the thermal oxide film and the parasitic capacitance between the word lines is also reduced.

FOURTH EMBODIMENT

The fourth embodiment is a modification of the first to third embodiments. More specifically, it relates to patterns of electrode takeout parts and addition of some steps for preventing short-circuits between electrodes.

In the step of FIG. 5 of the first embodiment explained above or the step of FIG. 11 of the second embodiment pattern the second word lines. In the etching at that time, since the underlying layer is the second charge storage film GD2, it is not possible to set too excessive an over etching time. The reason is that if the second charge storage film GD2 becomes thin at this portion due to excessive over etching, the insulation characteristics between word lines are liable to deteriorate.

Figure 16A:
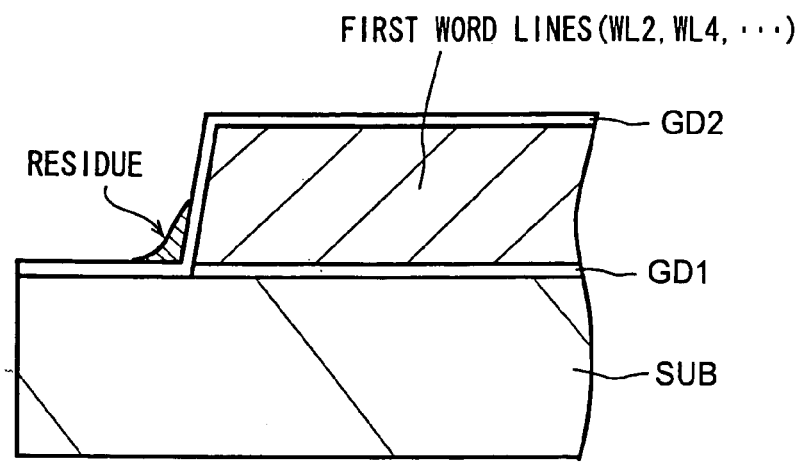
FIGS. 16A and 16B are a sectional view and plan view showing the problems in the first to third embodiments to be solved in the production of a nonvolatile memory device according to a fourth embodiment of the present invention.

After the etching of the second word lines, conductive residue of the material of the second word lines sometimes is left near the outskirts of the first word lines as shown for example in FIG. 16A. In particular, when depositing the conductive layer for forming the second word lines (for example, polycrystalline silicon), if this becomes thinner than the other regions at the regions above the first word lines, residue of the conductive material is liable to remain at the outskirts of the first word lines.

Figure 16B:
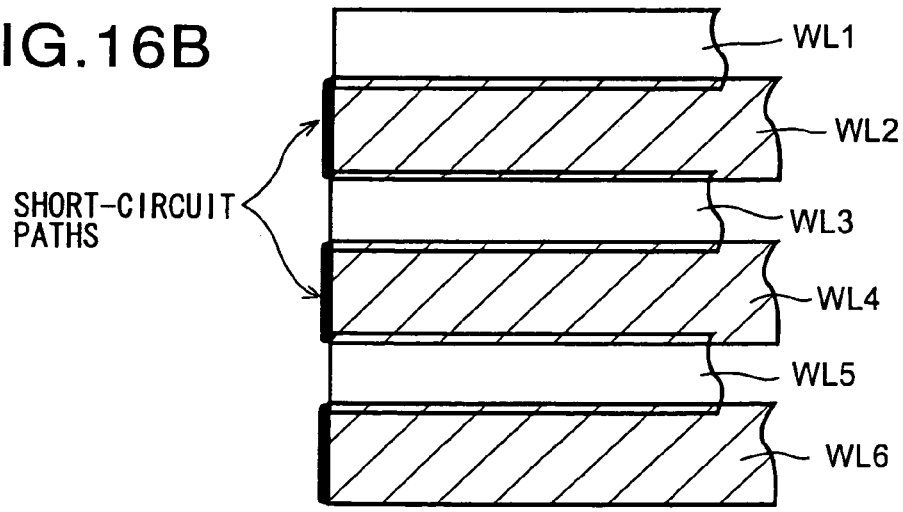

This residue is formed along the end surfaces of the first word lines as shown in FIG. 16B and ends up short-circuiting second word lines.

In the present embodiment, a step is added for cutting the residue midway so as to prevent short-circuits between word lines.

Further, if the word lines are formed by a pitch close to the minimum line width of photolithography as in the first to third embodiments, it becomes difficult to take out electrodes for connecting the word lines to the upper interconnect lines. In the present embodiment, mention will also be made of details of patterns for facilitating takeout of electrodes.

Figure 17:
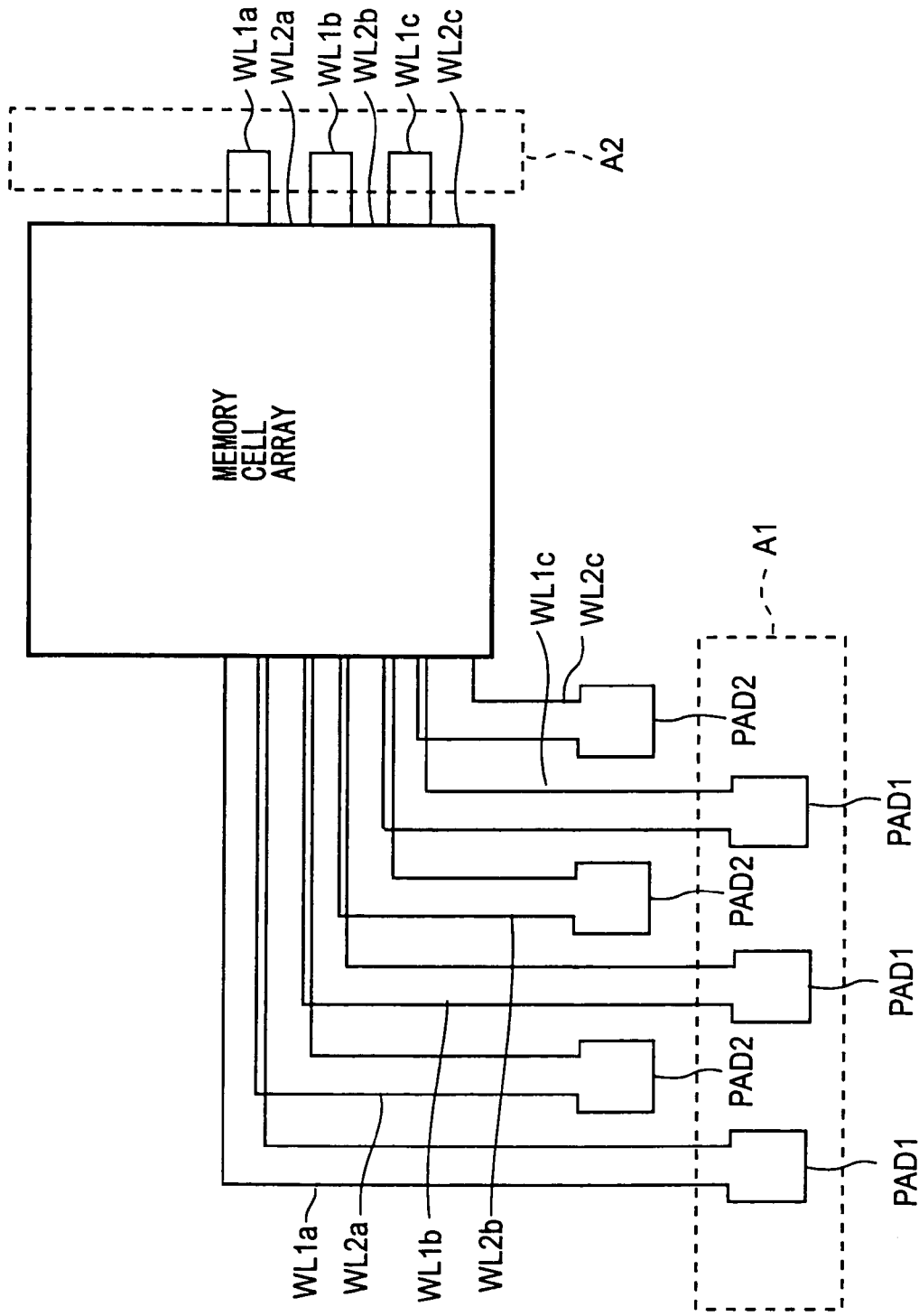
FIG. 17 is a plan view of a pattern of word lines around a memory cell array of the nonvolatile memory device according to the fourth embodiment.

FIG. 17 shows patterns of ends including electrode takeout parts of word lines in this embodiment.

The arrangement of word lines in the memory cell array is the same as in the first or second embodiments.

The word lines extending from the memory cell array to one direction are bent in a direction different from the direction of arrangement. Here, they are bent 90 degrees in the column direction from the row direction. The locations where the word lines are bent are successively shifted. The pitch of the locations of the word lines extending in the column direction is eased from the pitch in the memory cell array. Therefore, room is given for formation of broad electrode takeout parts PAD1 and PAD2 for connecting the word lines to not shown upper interconnect lines. The first word lines WL1a, WL1b, and WL1c formed from the first layer polycrystalline silicon have electrode takeout parts PAD1, while the second word lines WL2a, WL2b, and WL2c formed from the second layer polycrystalline silicon and partially overlapping the first word lines at the two sides have electrode takeout parts PAD2. Among these, the electrode takeout parts PAD1 are arranged at positions further outward from the electrode takeout parts PAD2.

At the other ends of the word lines as well, the first word lines WL1a, WL1b, and WL1c extend further outward fro the second word lines WL2a, WL2b, and WL2c.

The reason for extending the first word lines outward is to remove the conductive residue remaining at the peripheries of the first word lines at the ends of the first word lines to prevent the second word lines from electrically short-circuiting at the time of formation of the second word lines.

Specifically, at the time of the step of FIGS. 2A and 2B of the first embodiment, the step of FIGS. 8A and 8B of the second embodiment, or formation of the first word line in the FIG. 13 to FIG. 15 of the third embodiment, as shown in FIG. 17, a photomask of patterns of first word lines with one ends formed relatively long, with electrode takeout parts PAD1 formed at the front ends, and with other ends formed relatively long is used.

The steps of FIG. 3 and FIG. 4 or FIG. 9 and FIG. 10 are then followed to form the second charge storage film GD2, then the step of FIG. 5 or FIG. 11 is used to deposit polycrystalline silicon for forming the second word lines and resist patterns R are formed over it. At this time, as shown in FIG. 17, a photomask of patterns of second word lines with one ends formed relatively short (that is, shorter than the first word lines), with electrode takeout parts PAD2 formed at the front ends, and with other ends formed shorter than the first word lines is used.

Next, in the present embodiment, a step for removing the conductive residue is added. For example, resist patterns with openings made at the broken line parts A1 and A2 shown in FIG. 17 to expose the ends of the first word lines and covering and protecting the second word lines as a whole are formed. The resist patterns are used as a mask for partial over etching. The conditions of the etching gas etc. at this time are made the same as the time of the formation of the second word lines. The etching time is made the time by which the conductive residue is sufficiently removed at the openings. Due to this, the conductive residue is cut at those portions and the second word lines are completely electrically isolated.

Next, the same steps as in the first or second embodiment are followed to complete the nonvolatile memory.

FIFTH EMBODIMENT

The present embodiment is for solving other problems due to residue of the second word line forming material.

Under the residue shown in FIG. 16A, the second charge storage film GD2 remains in a complete form protected by the residue and maintaining the charge storage capability in the high state. As opposed to this, the second charge storage film GD2 of the surroundings is removed or even if remaining is exposed to etching, so falls considerably in charge storage capability.

The charge storage film under the residue sometimes stores a charge during gate processing or operation. In the case where the cells are N-channel types, the storage of electrons raises the threshold voltage, so there is not that much of a problem, but if holes are stored, the channels directly under the residue become depletion channels and the leakage between the sources and drains of the cells increases. Further, even if not a depletion type, if the threshold voltage is low, due to the capacitive coupling with the adjoining word lines to which the high positive voltage has been supplied, the potential of the residue in the electrically floating state rises, the channels of the parasitic transistors turn on, and the leakage increases.

The increase in the leakage gives rise to the disadvantages of particularly reducing the S/N ratio of the read signal for all cells at the time of reading and in turn causing mistaken reading.

This embodiment is for prevent such an increase in leakage. In the present embodiment, there are the following three methods of preventing leakage.

The first method selectively removes the residue at those portions.

The second method prevents the occurrence of residue at those portions by providing an odd number of word lines.

The third method takes into consideration the fact that the number of word lines is usually an even number and, in addition to the second method, uses the outside word line as a dedicated line for supplying a leakage prevention voltage.

Next, these three methods will be successively explained with reference to the drawings. Note that the drawings used here also use the technology of the above fourth embodiment overlappingly, but this overlapping application is not necessarily essential. Further, the components assigned reference numerals already explained will not be explained overlappingly here.

Figure 18:
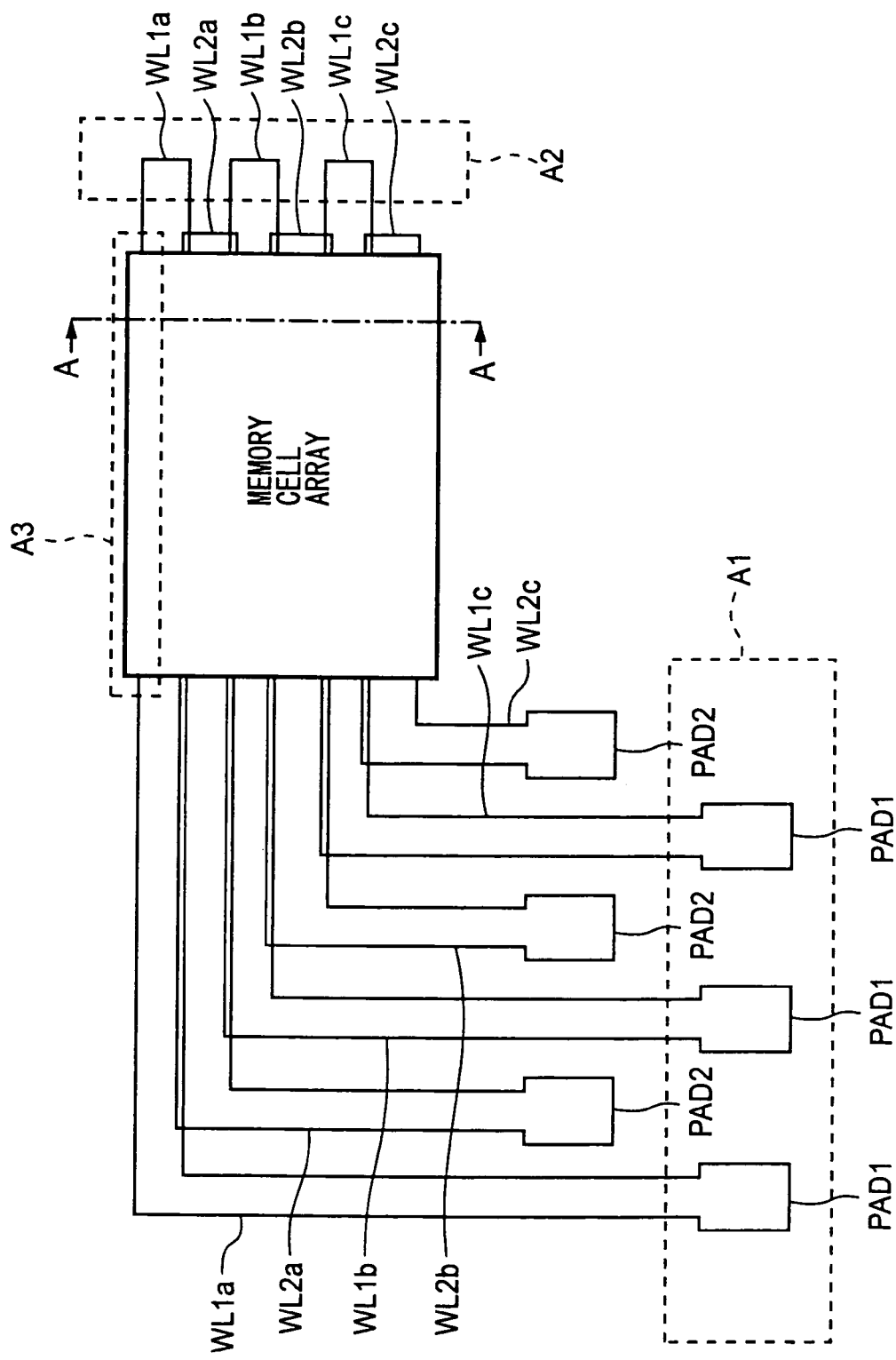
FIG. 18 is a plan view of the pattern of word lines of a nonvolatile memory device showing locations of removal of residue in a first method of preventing leakage according to a fifth embodiment of the present invention.
Figure 19:
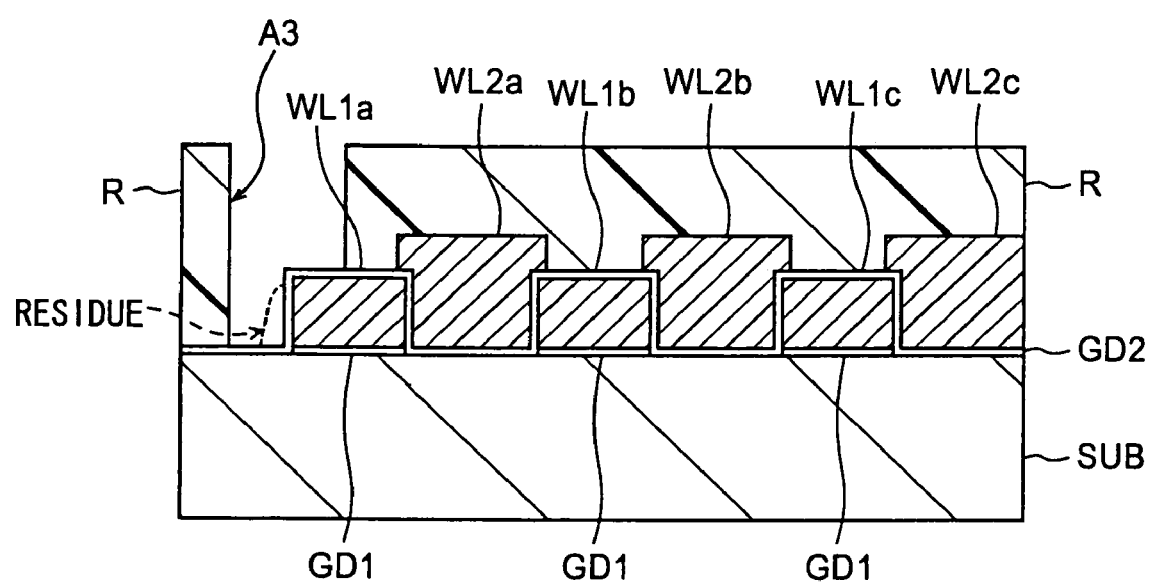
FIG. 19 is a sectional view of a nonvolatile memory device along the line A—A of FIG. 18 and shows the state after removal of residue using the first method of preventing leakage according to the fifth embodiment.

FIG. 18 is a plan view of a location of removal of residue in the first method. Further, FIG. 19 is a sectional view along the line A—A of FIG. 18 after removal of residue using the first method.

In the resist patterns R for removing the residue of the second word lines used in the fourth embodiment, in addition to the openings A1 and A2, as shown in FIG. 18, an opening A3 opening at least near the long side of the one of the outermost side first word lines, here, the word line WL1a, is added in advance on the patterns. Therefore, at the time of etching using the resist patterns R as a mask, the residue of the conductive material forming the second word lines exposed from the opening A3 as shown in FIG. 19 in addition to the openings A1 and A1 is effectively removed.

As a result, according to the first method, the advantage is obtained that the leakage current caused by the residue in the opening A3 is prevented or reduced.

FIG. 20 is a plan view of the case of use of the second method.

In the second method, an odd number of word lines is provided. That is, if the number of the first word lines is "n", (n+1) second word lines are provided. Due to this, second word lines are arranged at the outermost positions of the memory cell array. As a result, the problem of leakage due to residue of the second word lines is resolved.

Note that the usual number of word lines is even. Compared with this, one extra word line is added. In this case, it is also possible to configure the device so that for example an address signal is not allocated to the extra word line so as not to use it.

FIG. 21 gives a plan view and block diagram of the case of use of the third method.

In this third method, in the same way as in the second method, the number of word lines is made an odd number. Among these, the n number of word lines WL1a to WL2c have connected to them an ordinary word line drive circuit 51 driven by a row decoder 50 for decoding an input row address signal RAD. On the other hand, the extra one second word line WL2 is not driven by the row decoder 50 and is supplied with a write voltage at all times regardless of the write data. Further, a word line drive circuit 52 is connected for supplying a predetermined voltage for turning off the channel at all times at the time of a read operation. This word line drive circuit 52 corresponds to the "first word line drive circuit" in the present invention, while the ordinary word line drive circuit 51 driven by the row decoder 50 corresponds to the "second word line drive circuit" in the present invention.

In this third method, by optimizing the voltage supplied by the word line drive circuit 52, the channel directly under the word line WL2 is kept in the off state at all times and leakage current is prevented at the time of a read operation. Alternatively, by maintaining the write operation at all times regardless of the write data, electrons are sufficiently stored at all times in the charge storage film GD2 directly under the word line WL2. By making all of the cells using the word line WL2 gate enhancement types, occurrence of leakage current is prevented.

SIXTH EMBODIMENT

This embodiment relates to a semiconductor device according to the second aspect of the present invention.

Figure 22A:
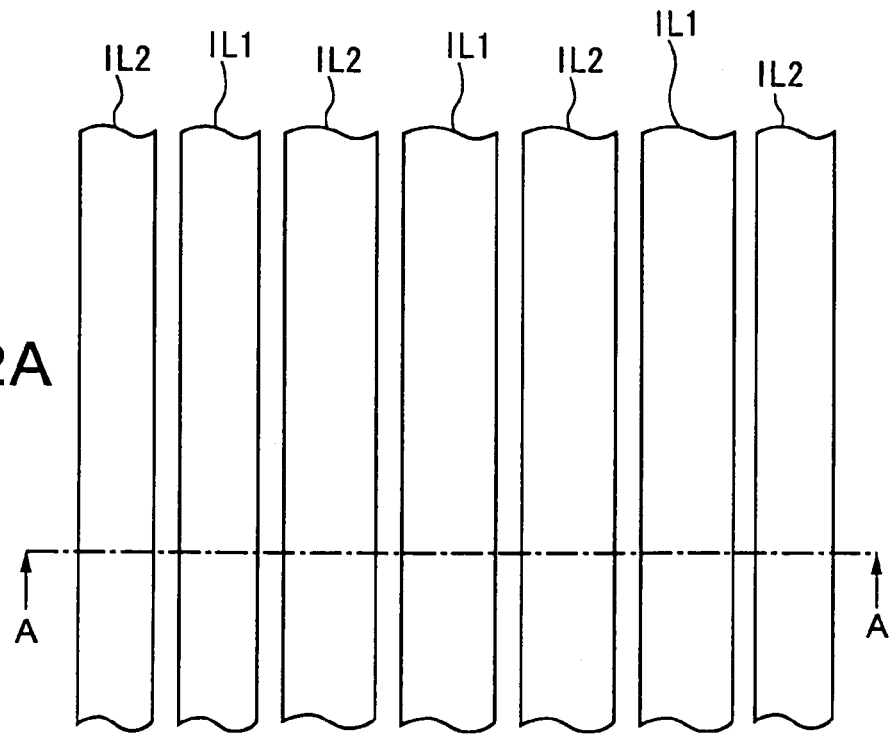
FIGS. 22A and 22B are a plan view and a sectional view along the line A—A showing the interconnect line structure of a semiconductor device according to a sixth embodiment of the present invention.
Figure 22B:
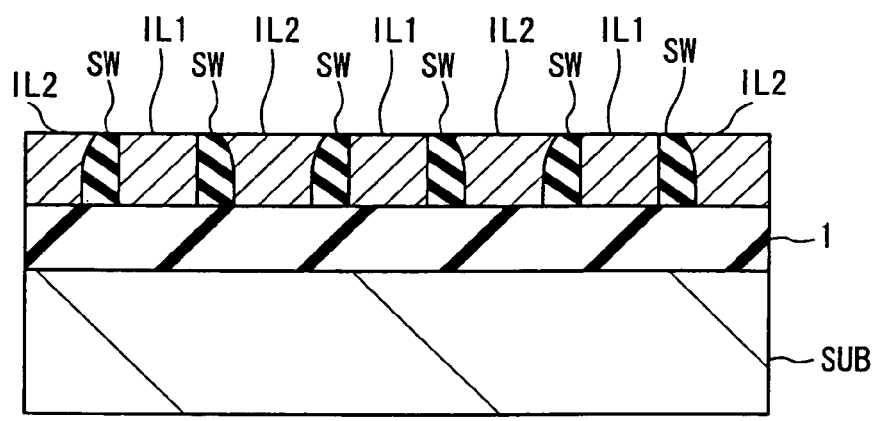

FIG. 22A is a plan view of the state after formation of interconnect lines of a semiconductor device according to the sixth embodiment, while FIG. 22B is a sectional view along line A—A of FIG. 22A.

This semiconductor device uses the interconnect line isolation structure of the present invention for the plurality of interconnect lines arranged in parallel at one layer.

A dielectric 1 supported on a substrate SUB is formed with first shape interconnect lines IL1 having substantially vertical sides or forward tapered sectional shapes. Further, between the first shape interconnect lines IL1 are formed second shape interconnect lines IL2 having at least top portions with reverse tapered sectional shapes. The first shape interconnect lines IL1 and second shape interconnect lines IL2 have interposed between them sidewall insulating layers having approximately ¼ circular sectional shapes (hereinafter simply called "sidewalls") SW. Due to this, two adjoining interconnect lines are insulated and isolated. Here, the "approximately ¼ circular sectional shape" means a shape having a first side of an approximately flat shape and a second side including at least a curved surface curved to an arc so as to become closer to the first side the higher up such as shown in FIG. 22B.

The sidewalls SW are formed at the sides of the first shape interconnect lines IL1. Therefore, the surfaces of the sidewalls SW opposite to the first shape interconnect lines IL1 are curved. The second shape interconnect lines IL2 are formed so as to be buried in recesses formed in the curved surfaces. As a result, the second shape interconnect lines IL2 have reverse tapered sectional shapes.

Note that the first and second shape interconnect lines IL1 and IL2 need only be parallel with each other. For example, they may also be winding as a whole. Further, they may be interconnect lines directly contacting the substrate SUB (for example, Schottkey metal).

Next, the procedure for formation of the interconnect lines will be explained while referring to the drawings. This procedure for formation relates to the fifth aspect of the present invention.

FIGS. 23A and 23B to FIG. 27 are sectional views (and plan views) of steps in the formation of interconnect lines. FIG. 23A, FIG. 25A, and FIG. 26A are plan views, while FIG. 23B, FIG. 25B, and FIG. 26B are sectional views along the line A—A. The other figures are all sectional views along the line A—A.

As shown in FIGS. 23A and 23B, a dielectric 1 on a substrate SUB is formed with a plurality of sacrificial layers 2 comprised of dielectrics. The plurality of sacrificial layers 2 are formed in stripes parallel to each other at pitches of about two times the interconnect lines to be formed.

As shown in FIG. 24, an insulating film 3 of a different material is deposited so as to cover the sacrificial layers 2. The material of the insulating film 3 selected is a material with a high etching selectivity to the sacrificial layers 2. For example, the sacrificial layers 2 are made silicon nitride films, while the insulating film 3 is made a silicon dioxide film. Further, parts of the insulating film 3 remain as the sidewalls in the end, so the material and method of formation are selected in consideration of the quality and insulation characteristics of the film.

Figure 25A:
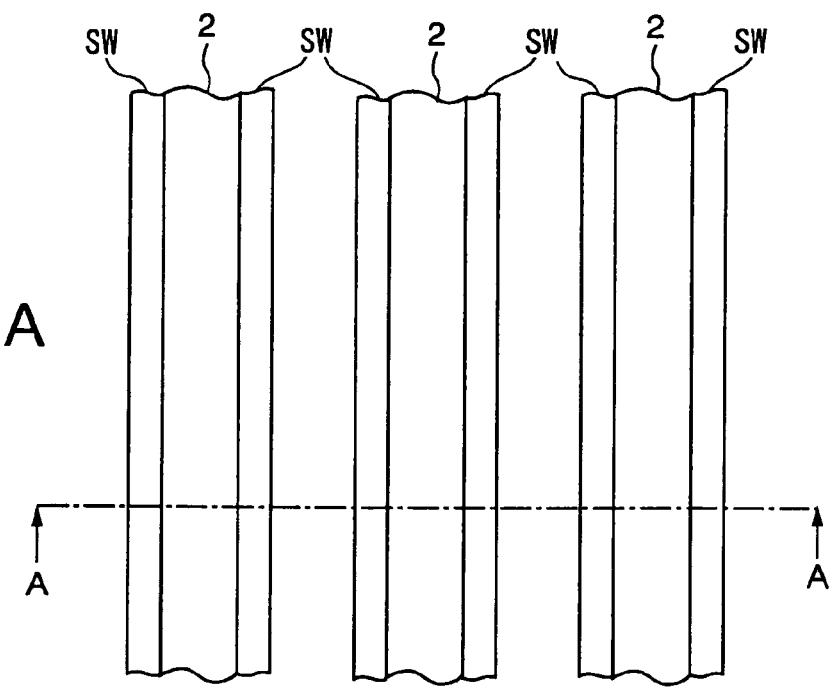
FIGS. 25A and 25B are a plan view and sectional view along the line A—A of the state after formation of sidewalls in the production of the semiconductor device according to the sixth embodiment.
Figure 25B:
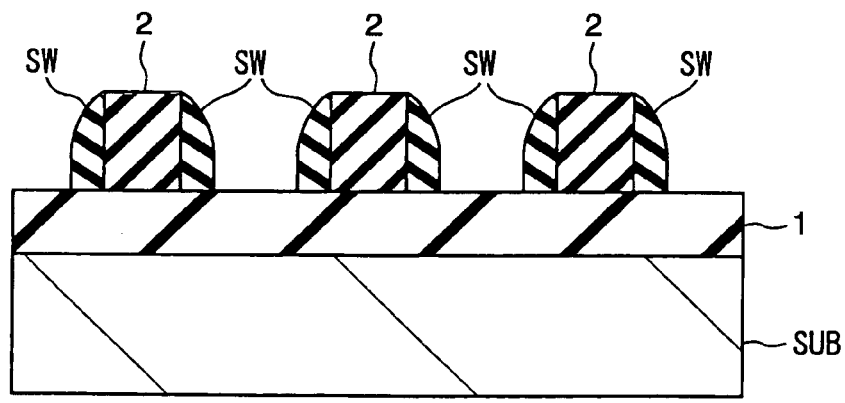

Next, the insulating film 3 is etched back by anistropic etching. Due to this, as shown in FIGS. 25A and 25B, sidewalls SW are formed at the sides of the sacrificial layers 2. The widths of the sidewalls SW are mainly determined by the height of the sacrificial layers 2 and the conditions of the anistropic etching. When the anistropy is strong to a certain extent, however, even if the etching time varies somewhat, the widths of the sidewalls do not change much, so the uniformity is relatively high.

Figure 26A:
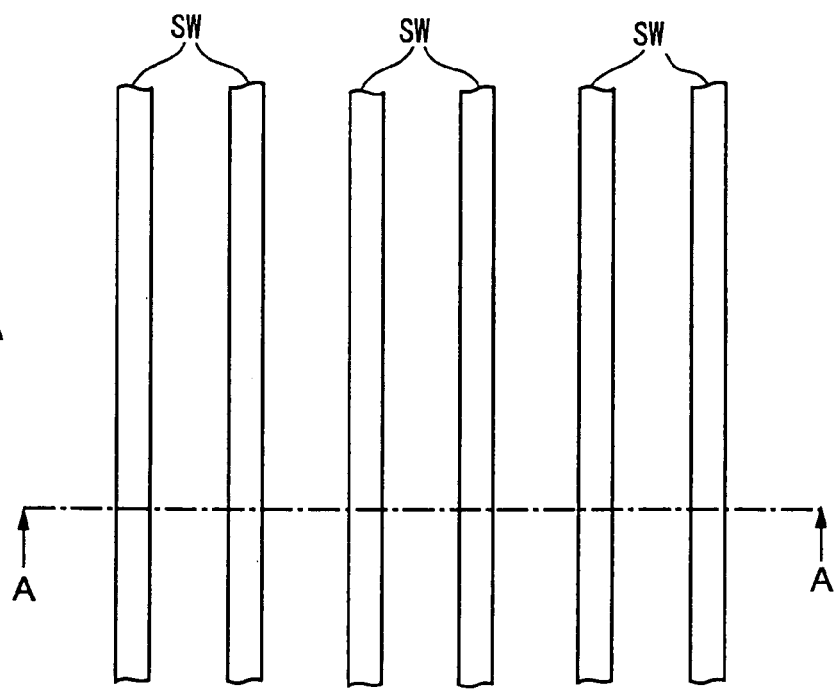
FIGS. 26A and 26B is a plan view and sectional view along the line A—A of the state after removal of a sacrificial layer in the production of the semiconductor device according to the sixth embodiment.
Figure 26B:
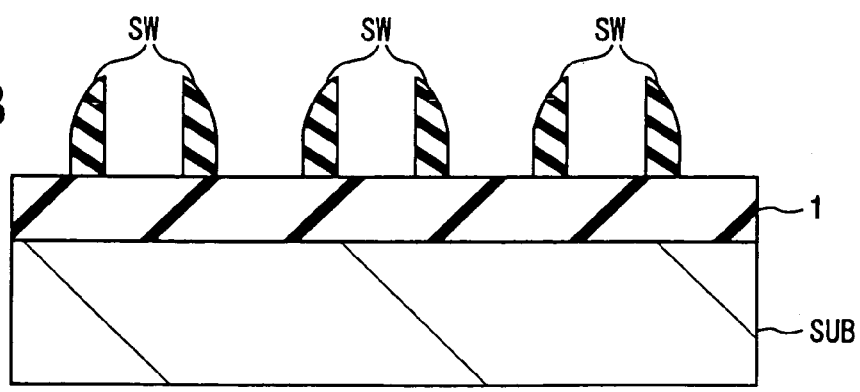

Next, the sacrificial layers 2 are selectively removed by a predetermined method. For example, with removal in the case where the sacrificial layers 2 are silicon nitride, wet processing using an etchant including fluoric acid FH is performed. Due to this, sidewalls SW remain as shown in FIG. 26A and FIG. 26B.

Figure 27:
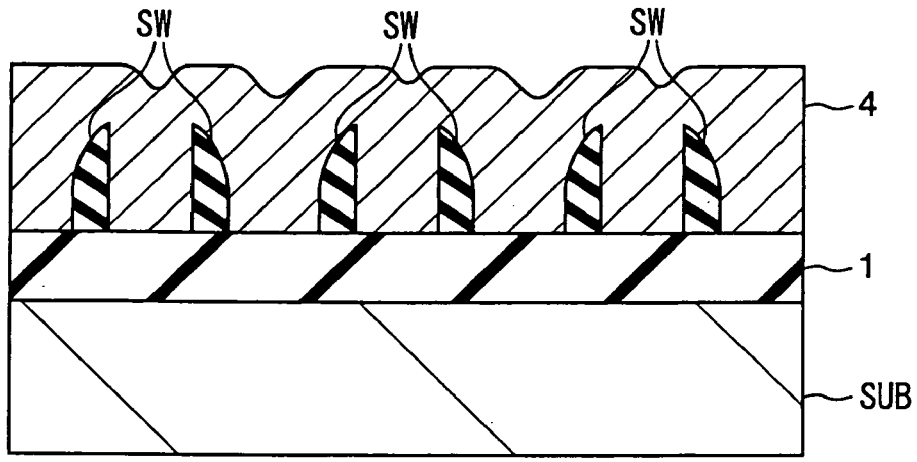
FIG. 27 is a sectional view of the state after deposition of a conductive film in the production of the semiconductor device according to the sixth embodiment.

As shown in FIG. 27, a conductive film 4 completely burying the sidewalls SW, for example, a film of a metal, doped polycrystalline silicon, or doped amorphous silicon, is deposited.

Next, for example, CMP or another method is used to grind and/or polish the surface of the conductive film 4. The grinding and/or polishing is continued until the sidewalls SW are exposed, the conductive film 4 isolated into a plurality of regions, and the isolation distance becomes the necessary value. Due to this, a plurality of interconnect lines IL1 and IL2 isolated by the sidewalls SW are formed at the necessary distances.

In the sixth embodiment, the distance between interconnect lines is determined by the sidewall insulating layers SW, so it is possible to reduce the distance between interconnect lines sufficiently from the limit of photolithography. At this time, the controllability of the distance between interconnect lines is also high.

SEVENTH EMBODIMENT

The seventh embodiment relates to a semiconductor device according to the third aspect of the present invention.

Figure 33:
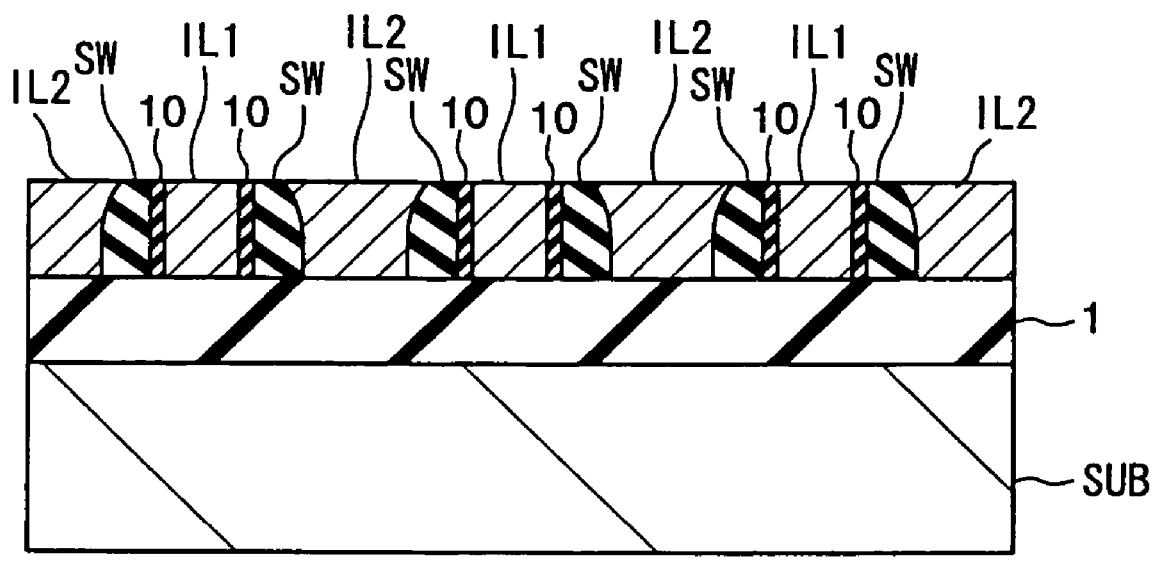
FIG. 33 is a sectional view of the interconnect line structure of the semiconductor device according to the seventh embodiment.

FIG. 33 is a sectional view of the interconnect line structure according to the third aspect.

The plan view of this interconnect line structure is similar to FIG. 22A. The interconnect line structure comprises a plurality of interconnect lines IL1 and IL2 arranged in parallel stripes. In the sectional view, the alternate arrangement of the first shape interconnect lines IL1 and the second shape interconnect lines 2 itself is common with FIG. 22B.

In the interconnect line isolation structure in the seventh embodiment, not only the sidewalls SW, but also the interposition of the thin thermal oxide film 10 between the sidewalls SW and the first shape interconnect lines IL1 differ from the first embodiment.

The thermal oxide film 10 is obtained by thermally oxidizing the surface of the first shape interconnect lines IL1 when they are doped polycrystalline silicon or doped amorphous silicon. Therefore, the controllability of the film thickness is extremely high. Further, the film is silicon dioxide obtained by thermal oxidation, so the quality is good. Therefore, there is the advantage that the insulation characteristics between interconnect lines are improved.

FIG. 28 to FIG. 32 are sectional views in the formation of the interconnect line structure.

Figure 28:
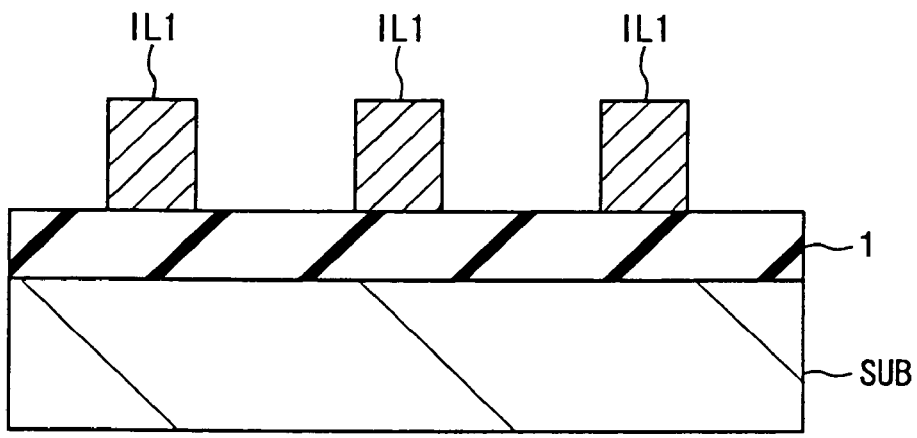
FIG. 28 is a sectional view of the state after formation of first shape interconnect lines in the production of a semiconductor device according to a seventh embodiment of the present invention.

As shown in FIG. 28, a dielectric 1 supported on a substrate SUB is formed with first shape interconnect lines IL1 at a pitch of about two times the final interconnect lines. The first shape interconnect lines IL1 are finally left, so are formed from doped polycrystalline silicon or doped amorphous silicon.

Figure 29:
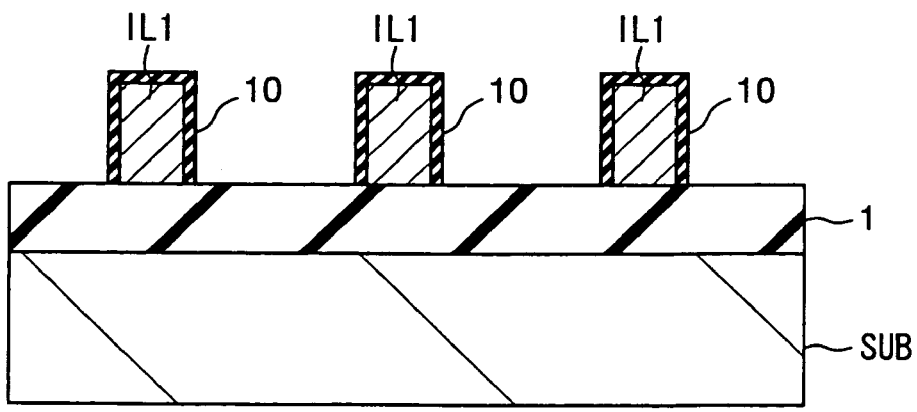
FIG. 29 is a sectional view of the state after formation of a thermal oxide film in the production of the semiconductor device according to the seventh embodiment.

As shown in FIG. 29, the surfaces of the first shape interconnect lines IL1 are thermally oxidized to form thermal oxide films 10 comprised of several nm to several tens of nm of silicon dioxide. Note that instead of thermal oxidation, it is also possible to nitride or oxynitride the surfaces by heating.

Figure 30:
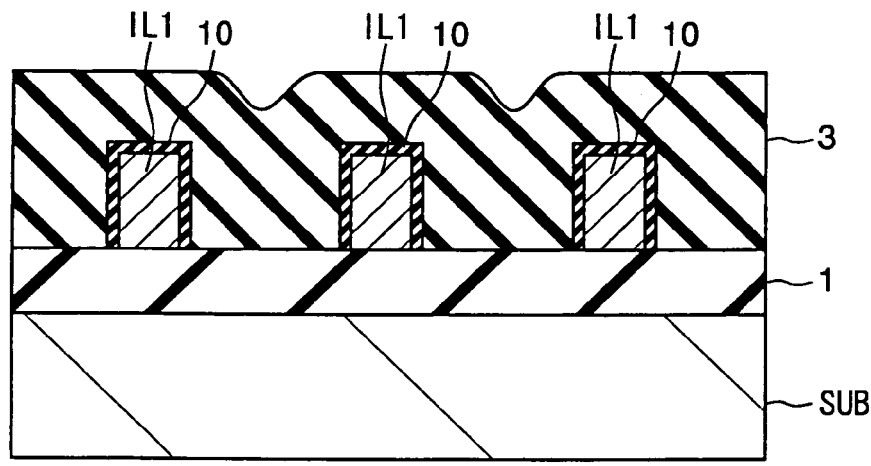
FIG. 30 is a sectional view of the state after deposition of a dielectric in the production of the semiconductor device according to the seventh embodiment.
Figure 31:
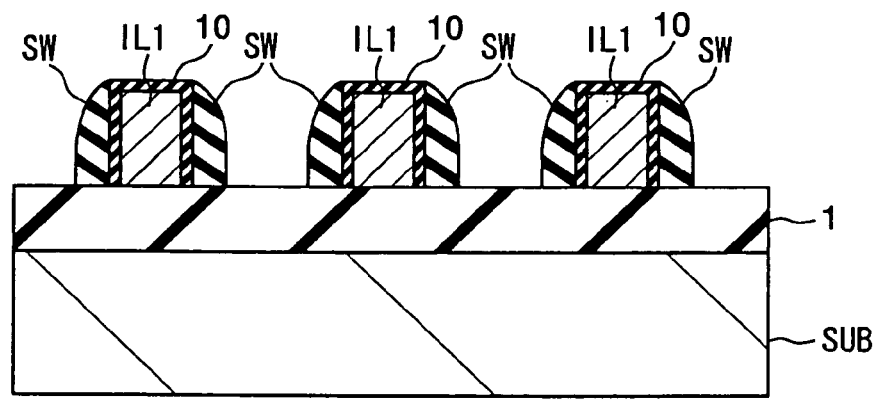
FIG. 31 is a sectional view of the state after formation of sidewalls in the production of the semiconductor device according to the seventh embodiment.
Figure 32:
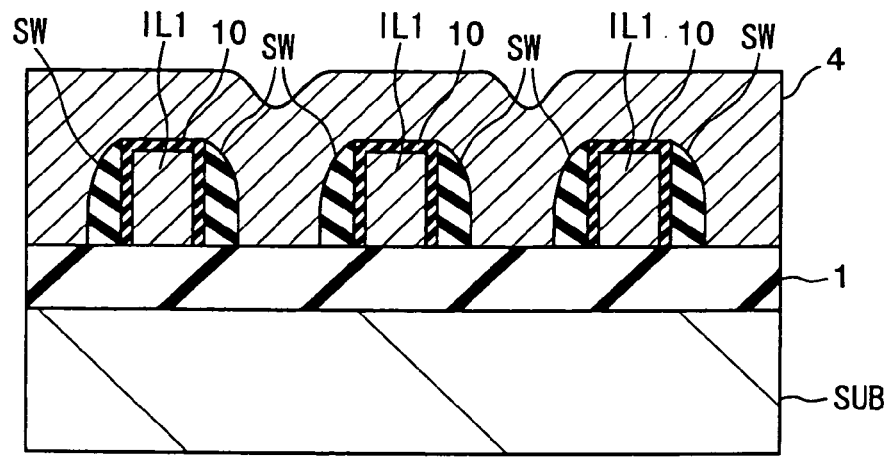
FIG. 32 is a sectional view of the state after deposition of a conductive film in the production of the semiconductor device according to the seventh embodiment.

Next, in the same way as the seventh embodiment, an insulating film 3 is deposited (FIG. 30). This is etched to form sidewalls SW (FIG. 31). Further, a conductive film 4 is deposited (FIG. 32), and this is ground and/or polished to form the plurality of interconnect lines IL1 and IL2.

In the seventh embodiment, it is possible to effectively improve the insulation characteristics by just thermal oxidation or other processing. Note that the step of removing the sacrificial layers as in the first embodiment is unnecessary. Therefore, there is no increase in the number of steps.

EIGHTH EMBODIMENT

The eighth embodiment shows a first example of the case of application of the method of formation of interconnect lines of the sixth embodiment to formation of word lines of a nonvolatile memory. Here, application to a NOR type memory cell array will be explained.

Figure 34A:
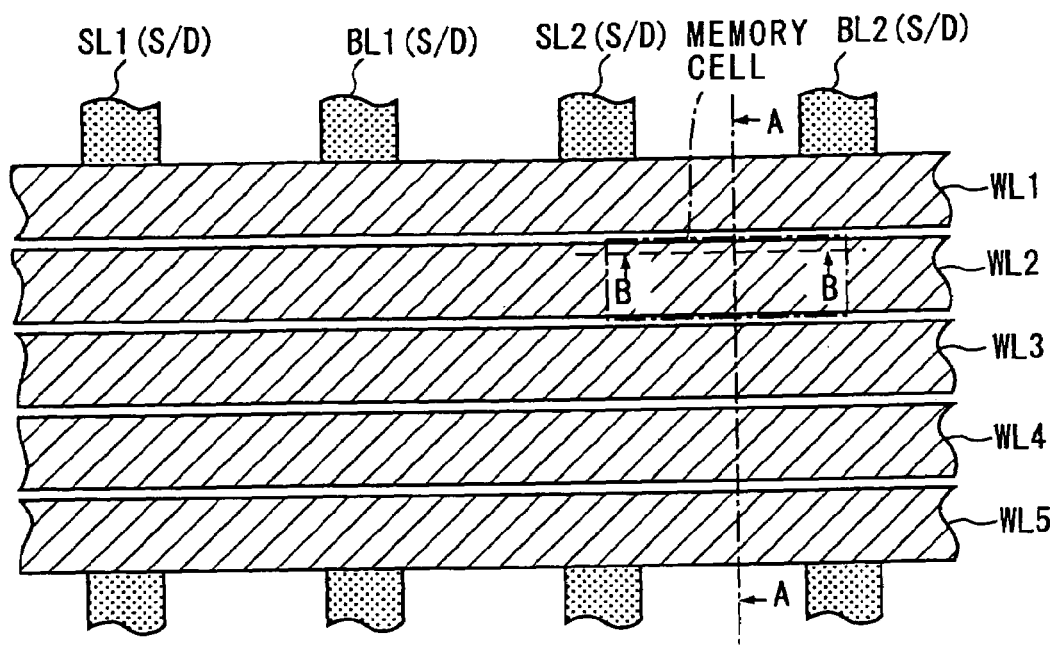
FIGS. 34A to 34C are a plan view and sectional views along the line A—A and line B—B of a NOR type memory cell array according to an eighth embodiment of the present invention.
Figure 34B:
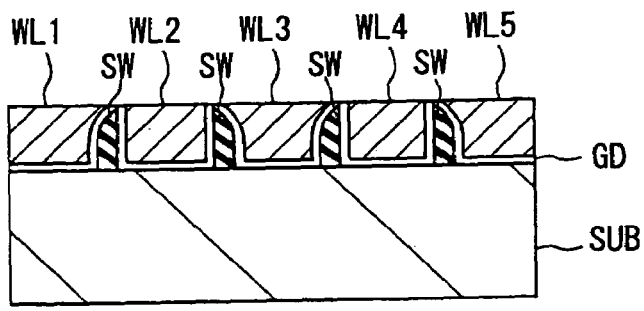

FIG. 34A is a plan view of a NOR type memory cell array using the present invention to reduce the distance between word lines. Further, FIG. 34B is a sectional view along the line A—A of FIG. 34A, while FIG. 34C is a sectional view along the line B—B of FIG. 34A.

Figure 34C:
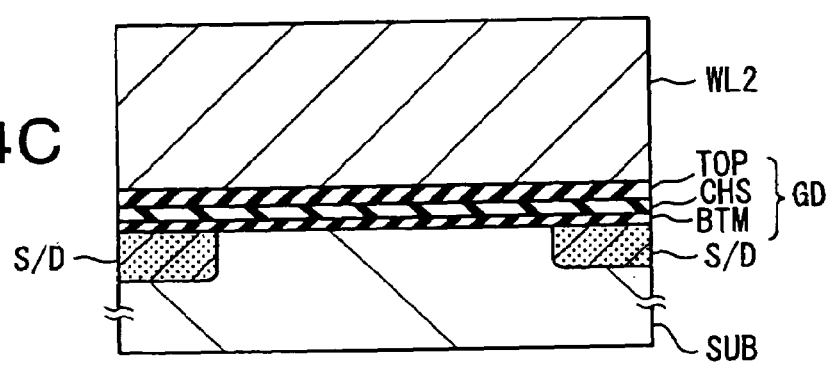

As shown in FIG. 34C, a P-type semiconductor substrate SUB is formed with source-drain regions S/D comprised of N-type impurity regions separated from each other. The source-drain regions S/D, as shown in FIG. 34A, form source lines SL1, SL2, . . . and bit lines BL1, BL2, . . . and have patterns of lines long in the column direction arranged in parallel stripes in the cell array as a whole.

The sidewalls SW are formed on the semiconductor substrate SUB extending long in a direction perpendicular to the source-drain regions S/D and in parallel.

A charge storage film GD is formed covering the surfaces of the sidewalls SW and the surface of the semiconductor substrate SUB. The charge storage film GD is a film including charge storing means inside. In the present embodiment, MONOS type memory transistors are illustrated, so the charge storage film GD comprises three layers of films of a so-called ONO type.

Specifically, the charge storage film GD comprises a bottommost layer of a first potential barrier film BMT, a middle layer of a charge trap film CHS, and a topmost layer of a second potential barrier film TOP. The first potential barrier film BTM comprises a thermal-oxidized silicon film obtained for example by thermally oxidizing the substrate surface to form a thermal silicon oxide film or an oxynitride film formed by nitriding the thermal-oxidized silicon film. The charge trap film CHS is comprised for example of silicon nitride or silicon oxynitride and includes in it a large number of charge traps as dispersed charge storing means. The second potential barrier film TOP is comprised for example of a silicon oxide film.

Note that in the case of a so-called MONOS type, the second potential barrier film TOP is omitted and the charge trap film CHS is formed relatively thickly. Further, in floating gate (FG) type using a conductive layer as the charge storage film, often the first potential barrier film and floating gate are stacked from the bottom and an inter-gate insulating film comprised of an ONO film is stacked on top of them.

The charge storage film GD has a total thickness of 10 odd nm or so converted to silicon dioxide. A conductive material is buried in recesses in the surface of the charge storage film GD. Due to this, wordlines WL1, WL2, . . . , W5, are formed. In the illustrated example, the even numbered word lines WL2, WL4, . . . have first shapes, while the odd numbered word lines WL1, WL3, . . . have second shapes.

Next, the procedure for formation of this NOR type memory cell array will be explained with reference to the drawings.

Figure 35A:
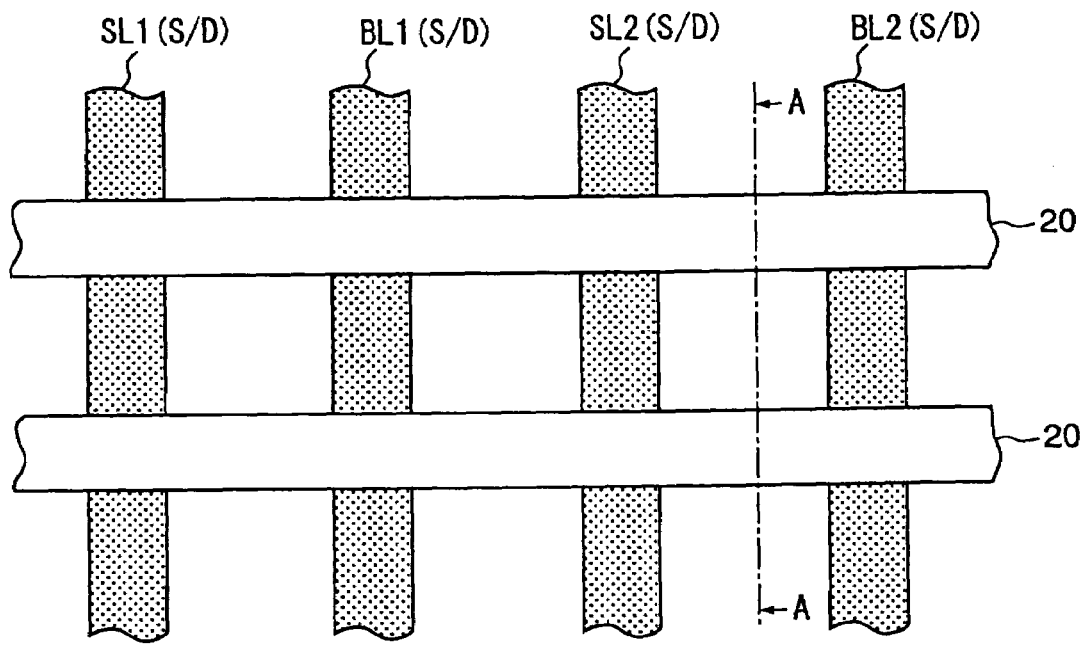
FIGS. 35A and 35B are a plan view and a sectional view along the line A—A of the state after formation of a sacrificial layer in the production of the semiconductor device according to the eighth embodiment.
Figure 35B:
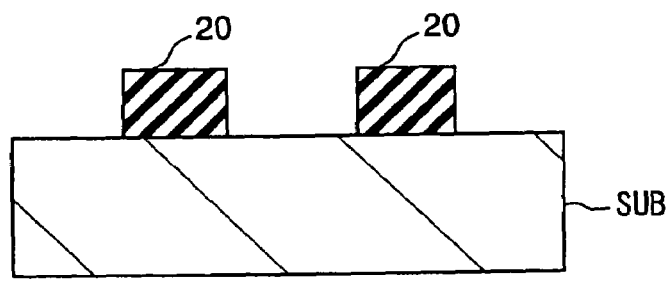

FIGS. 35A and 35B to FIG. 39 are sectional views (and plan views) of steps in the formation of word lines. FIG. 35A, FIG. 37A, and FIG. 38A are plan views, while FIG. 35B, FIG. 37B, and FIG. 38B are sectional views along the line A—A. The other figures are all sectional views along the line A—A.

First, the semiconductor substrate SUB is if necessary provided with a layer for isolating elements by a dielectric and injected with ions for adjusting the threshold voltage. A resist or other mask layer is formed on the semiconductor substrate and injected with ions, then activate it to form source-drain regions S/D (source lines SL1 and SL2 and bit lines BL1 and BL2).

As shown in FIG. 35A, a plurality of sacrificial layers 20 comprised of dielectrics are formed on the substrate SUB in parallel stripe patterns perpendicular to the source-drain regions S/D. The plurality of sacrificial layers 20 are formed in stripe shapes parallel with each other at pitches of about two times that of the word lines to be formed.

Figure 36:
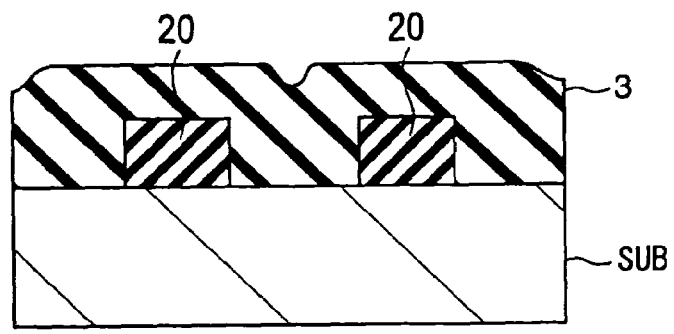
FIG. 36 is a sectional view of the state after deposition of a dielectric in the production of the semiconductor device according to the eighth embodiment.

As shown in FIG. 36, an insulating film 3 of a different material is deposited so as to cover the sacrificial layers 20. The material of the insulating film 3 selected is a material with a high etching selectivity with respect to the sacrificial layers 20. For example, the sacrificial layers 20 are made silicon nitride films, while the insulating film 3 is made a silicon dioxide film. Further, parts of the insulating film 3 remain in the end as the sidewalls, so the material and method of formation are selected in consideration of the quality and insulation characteristics etc. of the film.

Figure 37A:
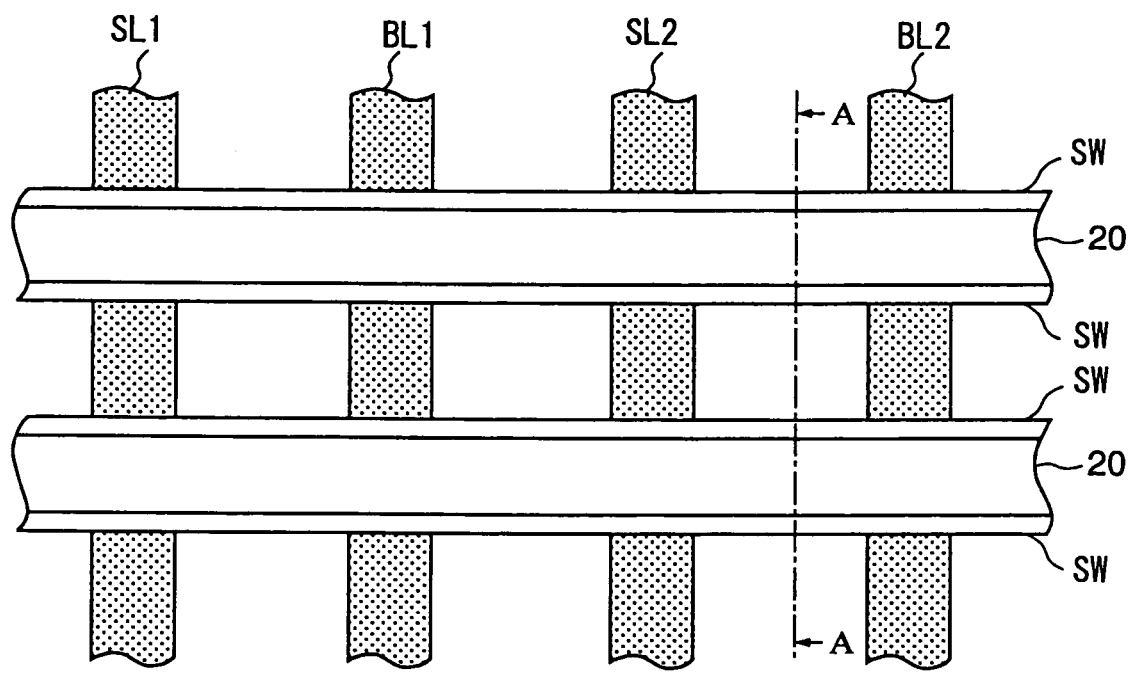
FIGS. 37A and 37B are a plan view and a sectional view along the line A—A of the state after formation of the sidewalls in the production of the semiconductor device according to the eighth embodiment.
Figure 37B:
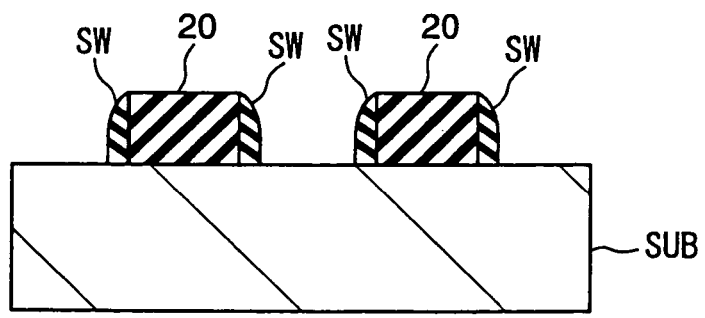

Next, the insulating film 3 is etched back by anistropic etching. Due to this, as shown in FIG. 37A and FIG. 37B, sidewalls SW are formed at the sides of the sacrificial layers 20. The widths of the sidewalls SW are mainly determined by the height of the sacrificial layers 20 and the conditions of the anistropic etching. When the anistropy is strong to a certain extent, however, even if the etching time varies somewhat, the widths of the sidewalls do not change much, so the uniformity is relatively high.

Figure 38A:
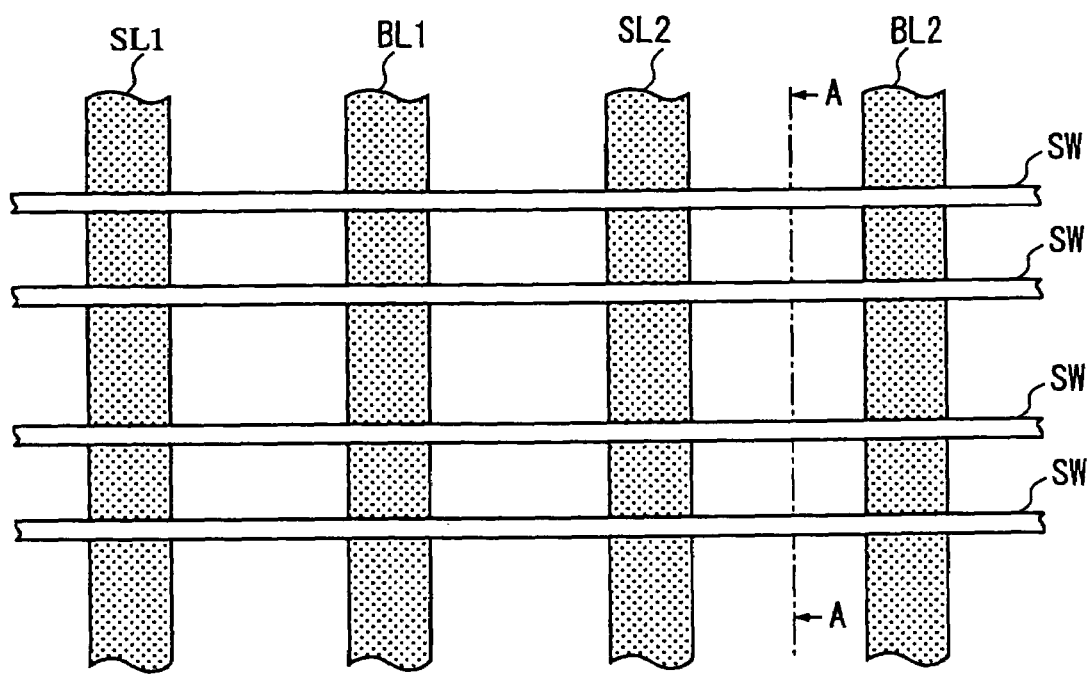
FIGS. 38A and 38B are a plan view and a sectional view along the line A—A of the state after removal of the sacrificial layer in the production of the semiconductor device according to the eighth embodiment.
Figure 38B:
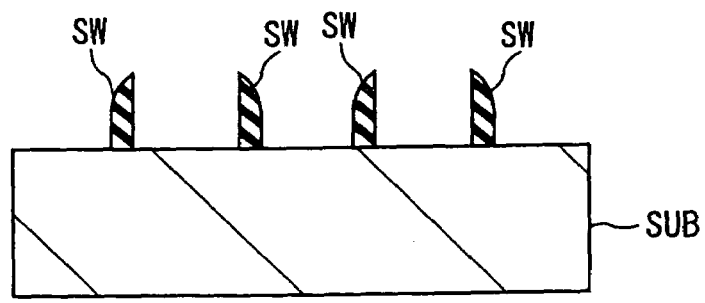

Next, the sacrificial layers 20 are selectively removed by a predetermined method. For example, with removal in the case where the sacrificial layers 20 are silicon nitride, wet processing using an etching including phosphoric acid ($H_3PO_4$) is performed. Due to this, sidewalls SW remain as shown in FIG. 38A and FIG. 38B.

Figure 39:
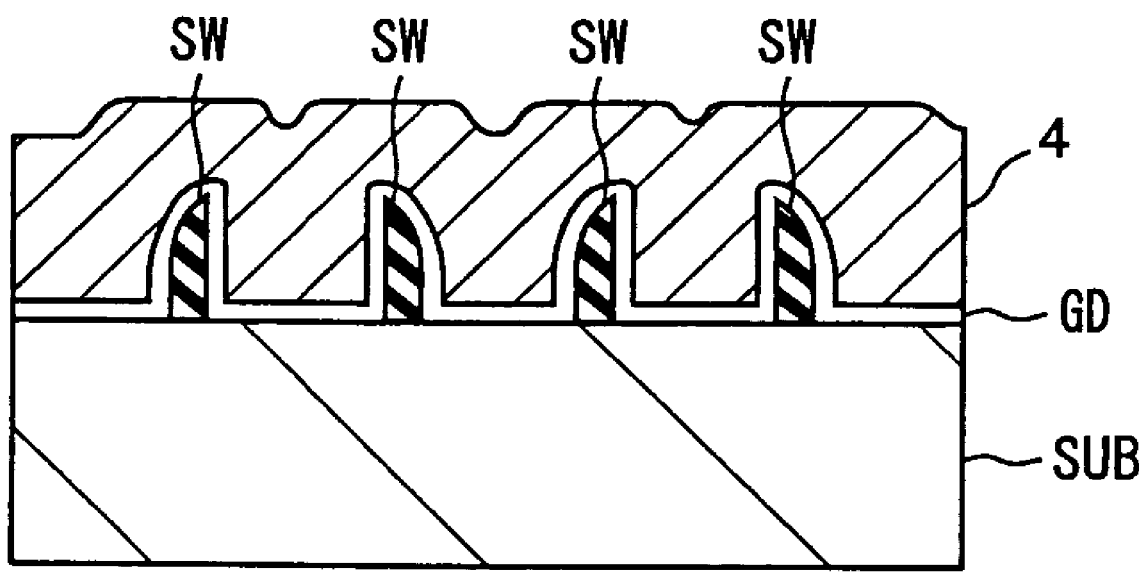
FIG. 39 is a sectional view of the state after deposition of a conductive film in the production of the semiconductor device according to the eighth embodiment.

As shown in FIG. 39, a conductive film 4 completely burying the sidewalls SW, for example, a film of a metal, doped polycrystalline silicon, or doped amorphous silicon, is deposited.

Next, for example, CMP or another method is used to grind and/or polish the surface of the conductive film 4. The grinding and/or polishing is continued until the sidewalls SW are exposed, the conductive film 4 isolated into a plurality of regions, and the isolation distance becomes the necessary value. Due to this, a plurality of word lines WL1, WL2, . . . WL5, isolated by the sidewalls SW are formed at the necessary distances.

Note that the grinding and/or polishing is continued until the charge trap film CHS is completely separated for each word line. In the case of an FG type where the charge storage film is a conductive material, however, separation of the charge storage film becomes essential. This is because if a floating gate FG is connected at such a location, the stored charge would leak to the adjoining cell and therefore data storage itself would become impossible. Further, sufficient grinding and/or polishing is necessary to avoid concentration of the electric field at that portion.

NINTH EMBODIMENT

The ninth embodiment shows a second example of the case of application of the method of formation of interconnect lines of the sixth embodiment to formation of word lines of a nonvolatile memory. Here, application to a NAND type memory cell array will be explained.

Figure 40:
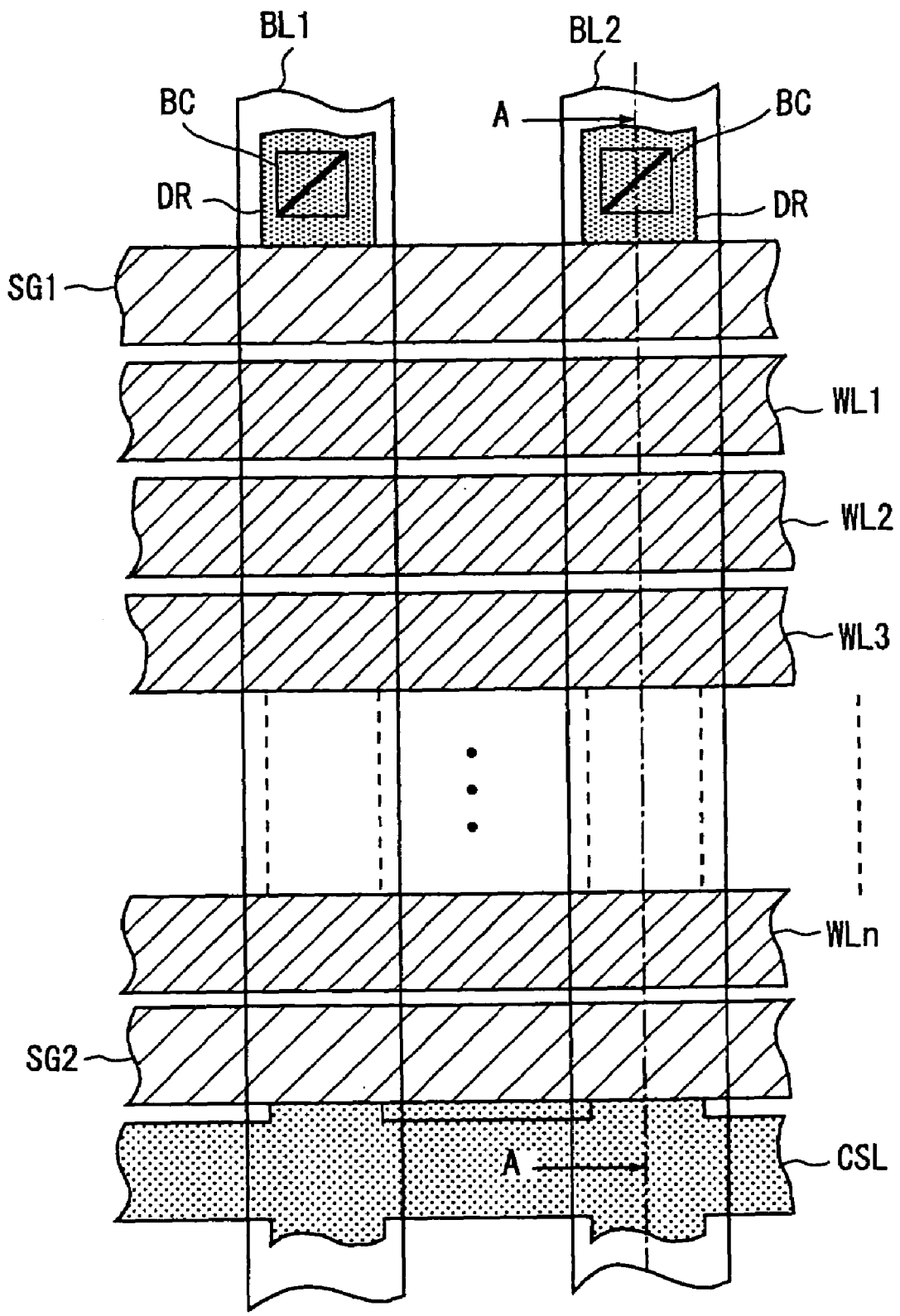
FIG. 40 is a plan view of a NAND type memory cell array according to a ninth embodiment of the present invention.

FIG. 40 is a plan view of a NAND type memory cell array using the present invention to reduce the distance between word lines. Further, FIG. 41A is a sectional view along the line A—A of FIG. 40, while FIG. 41B is a sectional view enlarging part of FIG. 41A.

Figure 41A:
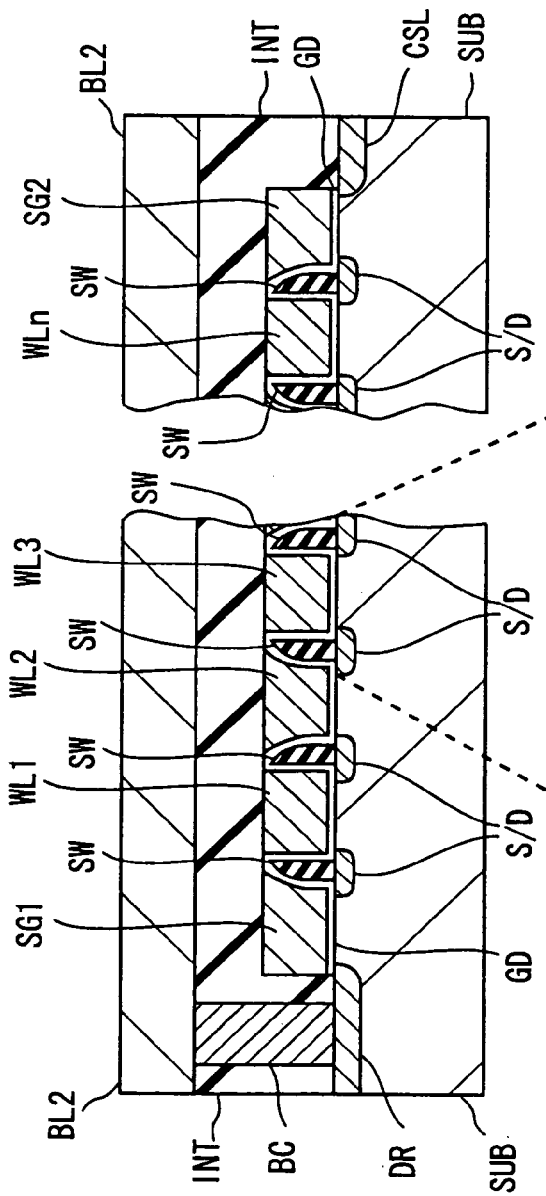
FIGS. 41A and 41B are a sectional view along the line A—A of the NAND type memory cell array according to the ninth embodiment and a partially enlarged view of the same.
Figure 41B:
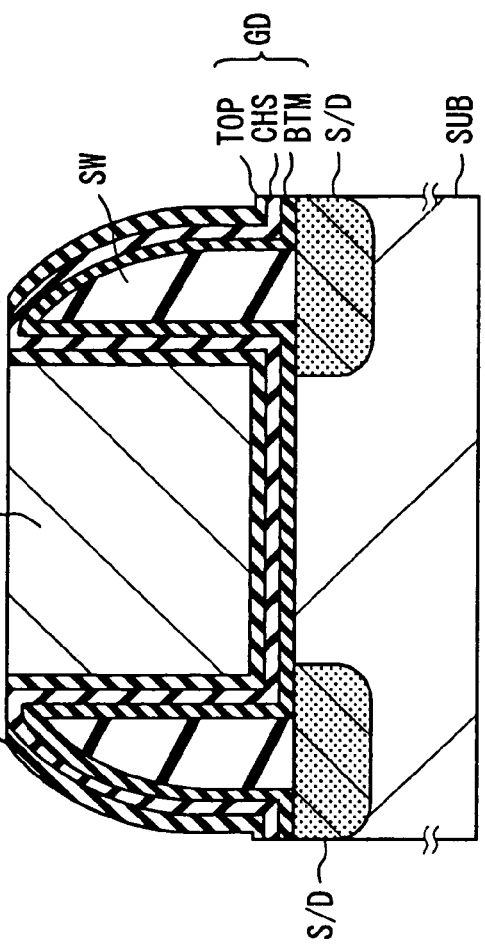

As shown in FIG. 41A and FIG. 41B, a P-type semiconductor substrate SUB is formed with word lines WL1, WL2, . . . WLn of substantially the same sectional structures as in the sixth embodiment. That is, the semiconductor substrate SUB is formed with sidewalls SW in the form of parallel stripes. A charge storage film GD is formed covering the surface of the sidewalls SW and the semiconductor substrate SUB. For example, in a MONOS type memory transistor, in the same way as in the sixth embodiment, the charge storage film GD comprises a bottommost layer of a first potential barrier film BMT, a middle layer of a charge trap film CHS, and a topmost layer of a second potential barrier film TOP.

This charge storage film GD has a total thickness of 10 odd nm or so converted to silicon dioxide. A conductive material is buried in recesses in the surface of the charge storage film GD whereby word lines WL1, WL2, . . . , WLn are formed. In the illustrated example, the odd numbered word lines WL1, WL3, . . . have first shapes, while the even numbered word lines WL2, WL4, . . . have second shapes.

At the outside of the word line WL1, a control gate line SG1 isolated by the sidewalls SW is arranged in parallel. Similarly, at the outside of the word line WLn, a control gate line SG2 isolated by the sidewalls SW is arranged in parallel. These control gate lines SG1 and SG2 are faced to the semiconductor substrate SUB where a charge storage film GD interposed in FIG. 41A, but no charge is injected into the charge storage film GD of those portions due to the applied bias conditions. Note that the production process becomes somewhat complicated, but the single layer of the charge storage film is formed only at those portions and the select transistors may be made ordinary MOS types.

With this interconnect line structure, source-drain regions S/D comprised of N-type impurity regions are formed only at the substrate portions around the regions below the sidewalls SW. The source-drain regions S/D are formed discretely only between word lines or a word line and control gate line. The lateral direction in FIG. 40 is isolated by not shown element isolation layers (for example, LOCOS).

A drain region DR comprised of an N-type impurity region is formed outside of the control gate film SG1. This drain region DR is shared with a not shown other NAND string.

Further, a common source line CSL comprised of an N-type impurity region is formed outward from the control gate SG2. The common source line CSL is shared inside one row's worth of a NAND string arranged in the row direction and with a not shown other row's worth of the NAND string adjoining it in the column direction.

The transistors forming these NAND strings have formed on them an interlayer insulating film INT. The interlayer insulating film INT has bit lines BL1, BL2 arranged on it in a parallel stripe form. The bit lines are connected with the corresponding drain regions DR by bit contacts BC formed on the interlayer insulating film INT.

Next, the procedure for formation of this NAND type memory cell array will be explained with reference to the drawings.

FIGS. 42A and 42B to FIGS. 49A and 49B are sectional views (and plan views) of steps in the formation of word lines. FIG. 42A, FIG. 44A, FIG. 45A, FIG. 47A, and FIG. 49A are plan views, while FIG. 42B, FIG. 44B, FIG. 45B, FIG. 47B, and FIG. 49B are sectional views along the line A—A. The other figures are all sectional views along the line A—A.

First, the semiconductor substrate SUB is if necessary provided with an element isolation layer and injected with ions for adjusting the threshold voltage.

Figure 42A:
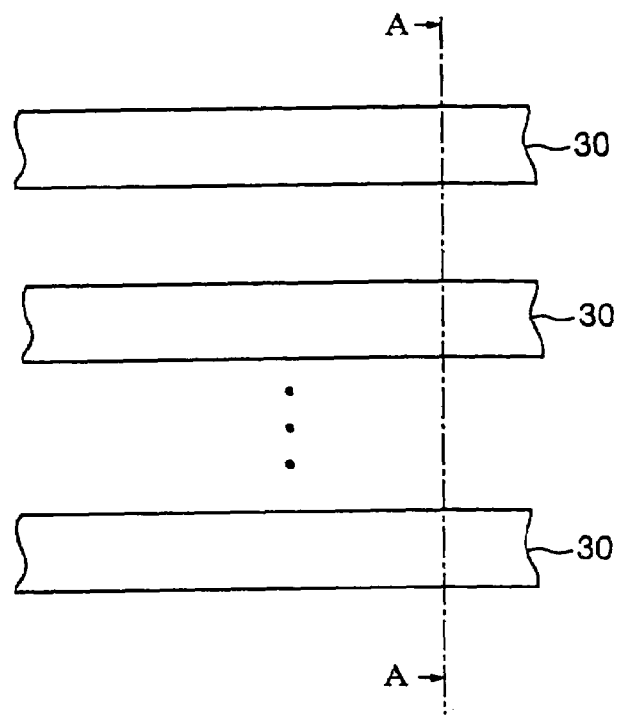
FIGS. 42A and 42B are a plan view and a sectional view along the line A—A of the state after formation of a sacrificial layer in the production of a semiconductor device according to the ninth embodiment.
Figure 42B:
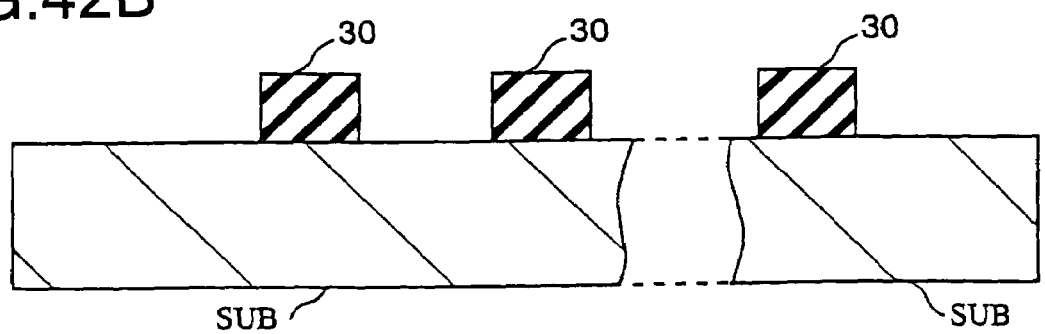

As shown in FIG. 42A, a plurality of sacrificial layers 30 comprised of dielectrics are formed on the substrate SUB in parallel stripe patterns. The plurality of sacrificial layers 30 are formed in stripe shapes parallel with each other at pitches of about two times that of the word lines to be formed.

Figure 43:
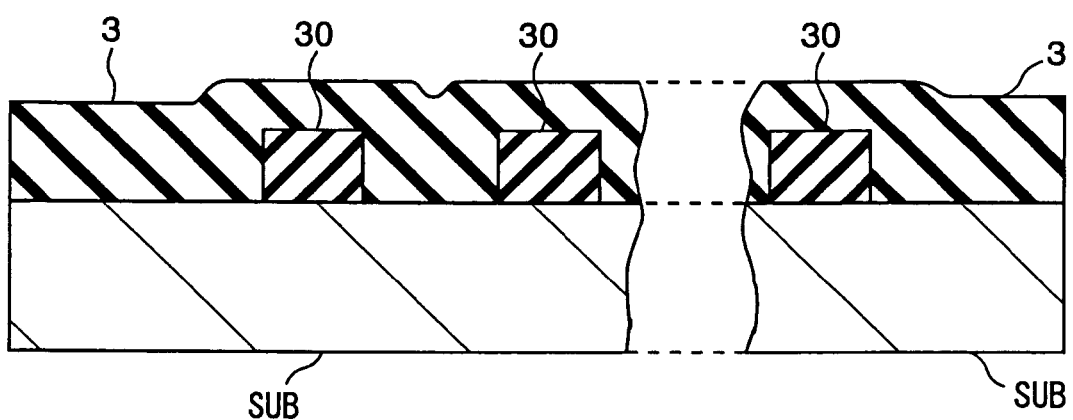
FIG. 43 is a sectional view of the state after deposition of a dielectric in the production of the semiconductor device according to the ninth embodiment.

As shown in FIG. 43, an insulating film 3 of a different material is deposited so as to cover the sacrificial layers 30. The material of the insulating film 3 selected is a material with a high selectivity with respect to the sacrificial layers 30. For example, the sacrificial layers 30 are made silicon nitride films, while the insulating film 3 is made a silicon dioxide film. Further, parts of the insulating film 3 remain in the end as the sidewalls, so the material and method of formation are selected in consideration of the quality and insulation characteristics etc. of the film.

Figure 44A:
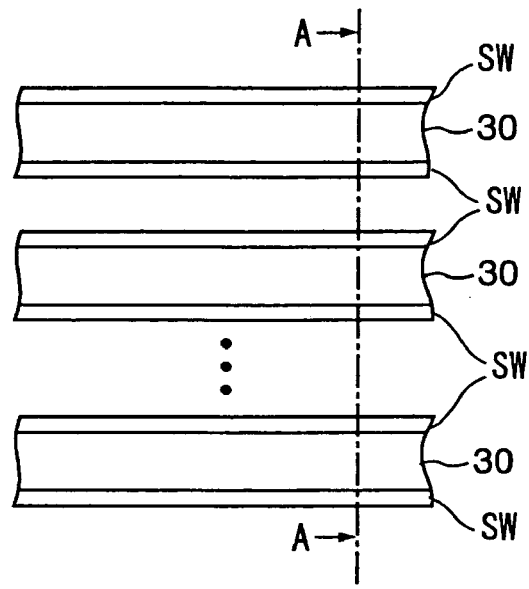
FIGS. 44A and 44B are a plan view and a sectional view along the line A—A of the state after formation of sidewalls in the production of the semiconductor device according to the ninth embodiment.
Figure 44B:
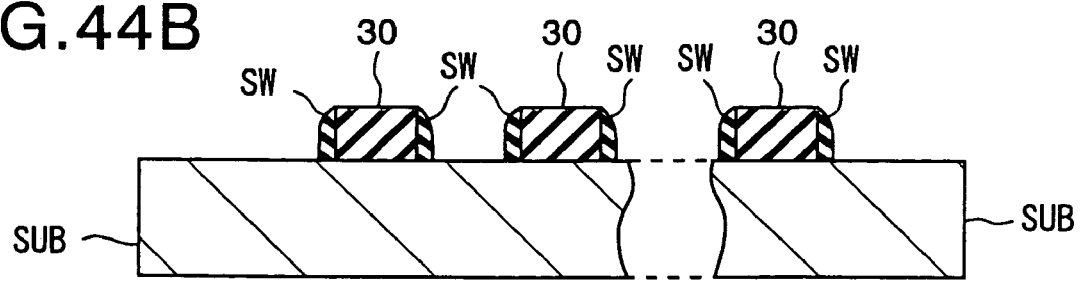

Next, the insulating film 3 is etched back by anistropic etching. Due to this, as shown in FIG. 44A and FIG. 44B, sidewalls SW are formed at the sides of the sacrificial layers 30. The widths of the sidewalls SW are mainly determined by the height of the sacrificial layers 30 and the conditions of the anistropic etching. When the anistropy is strong to a certain extent, however, even if the etching time varies somewhat, the widths of the sidewalls do not change much, so the uniformity is relatively high.

Next, the sacrificial layers 30 are selectively removed by a predetermined method. For example, with removal in the case where the sacrificial layers 30 are silicon nitride, wet processing using an etching including phosphoric acid ($H_3PO_4$) is performed. Due to this, sidewalls SW remain as shown in FIG. 45A and FIG. 45B.

As shown in FIG. 46, a conductive film 4 completely burying the sidewalls SW, for example, a film of a metal, doped polycrystalline silicon, or doped amorphous silicon, is deposited.

Figure 47A:
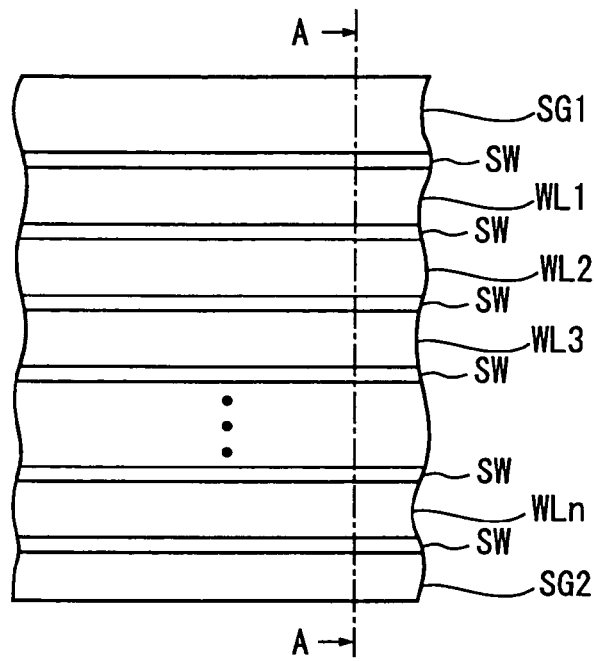
FIGS. 47A and 47B are a plan view and a sectional view along the line A—A of the state after formation of word lines in the production of the semiconductor device according to the ninth embodiment.
Figure 47B:
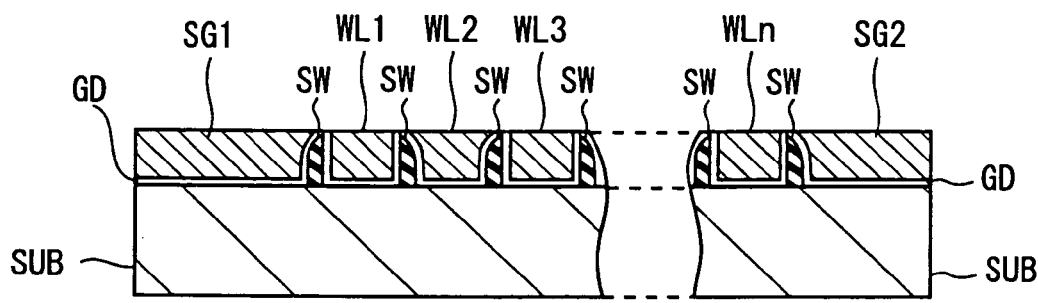

Next, for example, CMP or another method is used to grind and/or polish the surface of the conductive film 4. The grinding and/or polishing is continued until the sidewalls SW are exposed, the conductive film 4 isolated into a plurality of regions, and the isolation distance becomes the necessary value. Due to this, as shown in FIG. 47A and FIG. 47B, a plurality of word lines WL1, WL2, . . . WLn and control gates SG1 and SG2 isolated by the sidewalls SW are formed at the necessary distances.

Note that the grinding and/or polishing is continued until the charge trap film CHS is completely separated for each word line. In the case of an FG type where the charge storage film is a conductive material, however, separation of the charge storage film becomes essential. This is because if a floating gate FG is connected at such a location, the stored charge would leak to the adjoining cell and therefore data storage itself would become impossible. Further, sufficient grinding and/or polishing is necessary to avoid concentration of the electric field at that portion.

Figure 48:
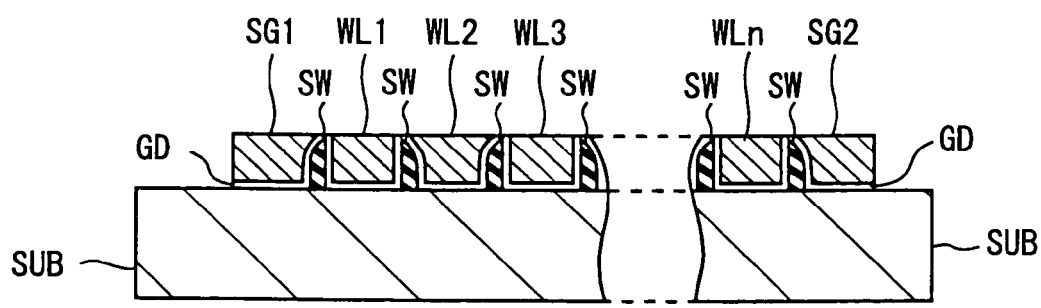
FIG. 48 is a sectional view of the state after processing selection gate lines in the production of the semiconductor device according to the ninth embodiment.
Figure 49A:
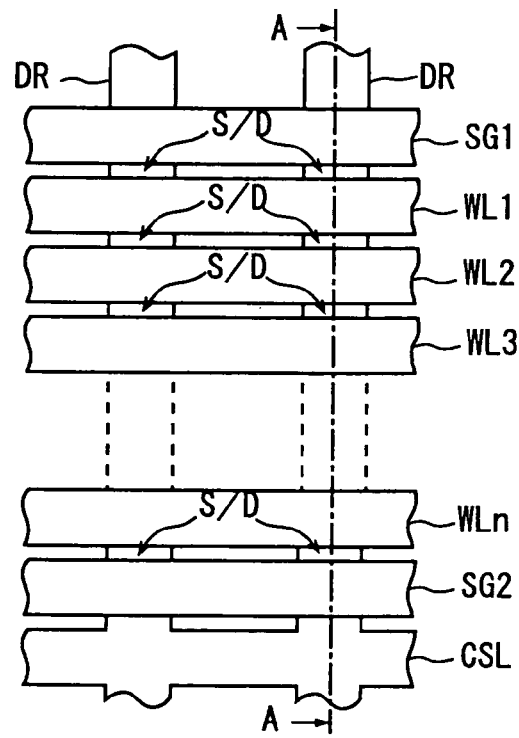
FIGS. 49A and 49B are a plan view and a sectional view along the line A—A of the state after formation of source-drain regions in the production of the semiconductor device according to the ninth embodiment.
Figure 49B:
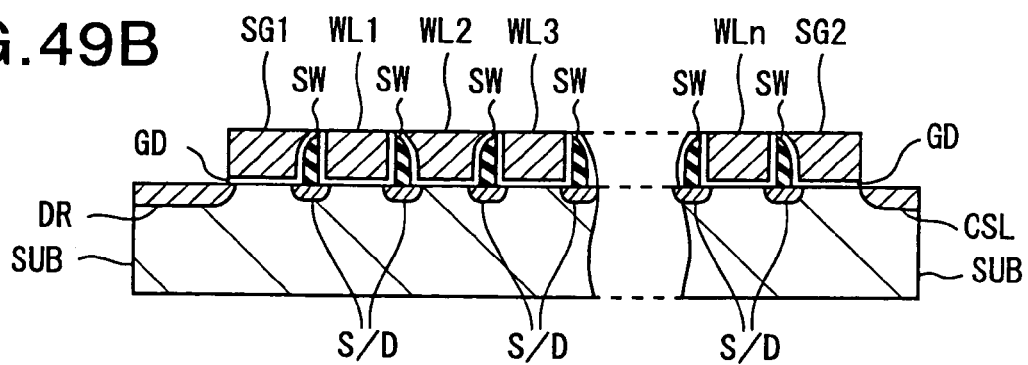

As shown in FIG. 48, the control gate lines SG1 and SG2 are made to become predetermined line widths by forming a mask layer covering parts of the word lines WL1, WL2, . . . , WLn and the control gate lines SG1 and SG2 and etching it to selectively remove the peripheral portions of the mask layer.

The mask layer is removed, then an N-type impurity is injected into the semiconductor substrate SUB. At this time, the ion injection conditions are determined so that the ions will not pass through the interconnect line layer portions, but the ions will pass through the sidewall portions to reach the substrate. Due to this, the source-drain regions S/D, drain regions DR, and common source lines CSL are simultaneously formed. At this time, the preformed element isolation layer may also function as a mask at the time of ion injection.

Note that when it is difficult to form source-drain regions S/D having the desired concentration and depth by just optimization of the ion injection conditions, the sidewalls SW may be removed once, the ions injected, then the sidewall shaped spaces buried with an insulating material again.

Next, the interlayer insulating film INT is deposited, the bit contacts BC are formed, and the bit lines are formed to complete the nonvolatile memory.

10TH EMBODIMENT

The 10th embodiment shows a first modification of the formation of word lines of a nonvolatile memory.

FIG. 50A to FIG. 50C and FIG. 51A to FIG. 51D are sectional views along the line width direction shown centered on the word line portion. This embodiment can also be applied to any of the types of memory cell arrays of the eighth and ninth embodiments.

Figure 51A:
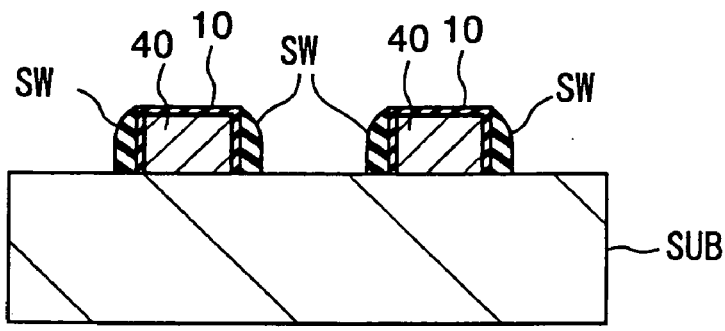
FIGS. 51A to 51D are sectional views of the state up to formation of word lines in the production of the semiconductor device according to the 10th embodiment.
Figure 51B:
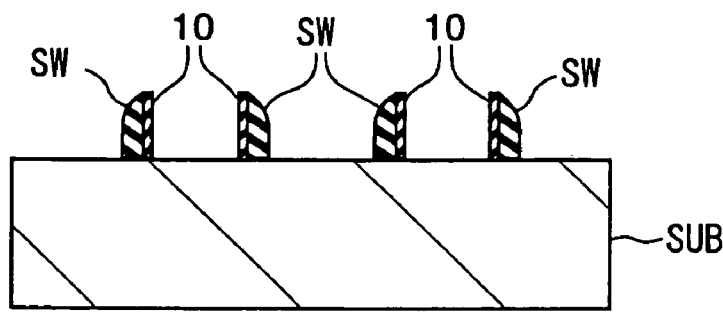
Figure 51C:
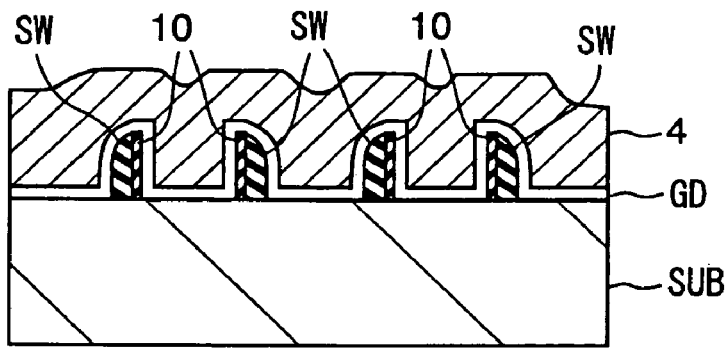
Figure 51D:
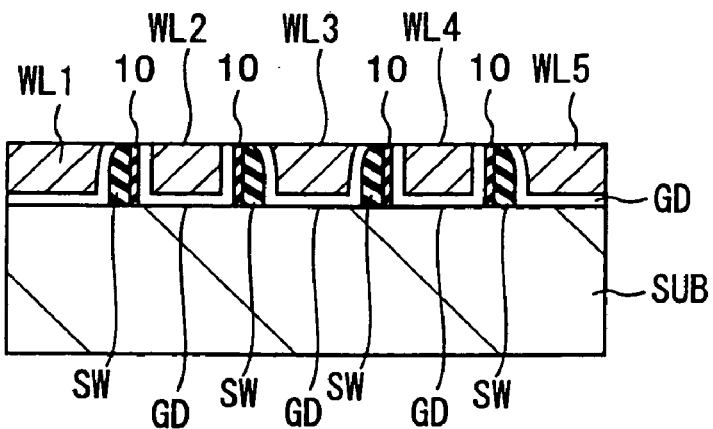

In the interconnect line isolation structure in the 10th embodiment, as shown in FIG. 51D, in addition to the sidewalls SW, the interposition of a thin thermal oxide film 10 between the charge storage film GD at the first shape word line WL2, WL4, . . . side and sidewalls SW differs from the eighth and ninth embodiments.

The thermal oxide film 10 is obtained by thermal oxidation of doped polycrystalline silicon or doped amorphous silicon. Therefore, the controllability of the film thickness is extremely high. Further, since the film is silicon dioxide obtained by thermal oxidation, it is good in quality. Therefore, there is the advantage that the insulation characteristics between interconnect lines are improved.

Figure 50A:
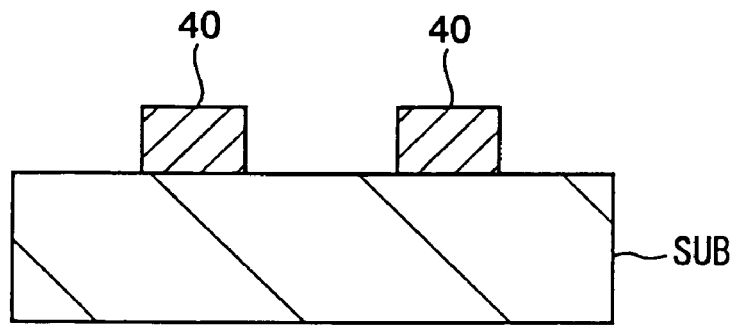
FIGS. 50A to 50C are sectional views of the state up to deposition of a dielectric in the production of a semiconductor device according to a 10th embodiment of the present invention.

In the formation of the interconnect line structure, first, as shown in FIG. 50A, the substrate SUB is formed with a sacrificial layer 40 at a pitch of about two times the final interconnect lines. This sacrificial layer 40 is formed from doped polycrystalline silicon or doped amorphous silicon.

Figure 50B:
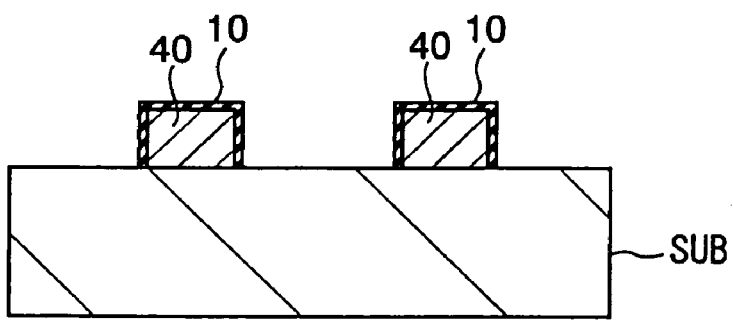
Figure 50C:
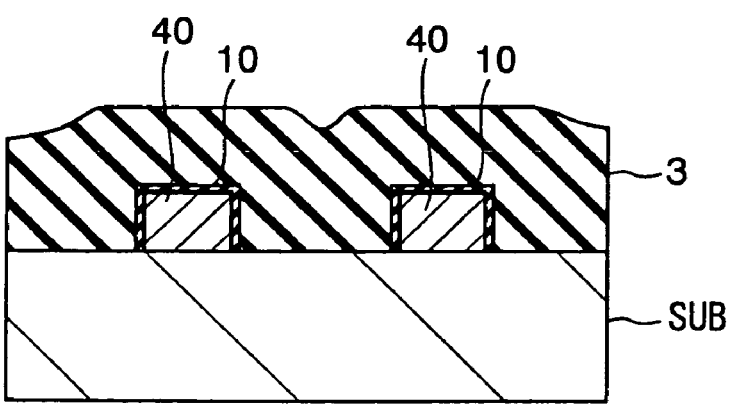

As shown in FIG. 50B, the surface of the sacrificial layer 40 is thermally oxidized to form a thermal oxide film 10 comprised of several nm to several tens of nm of silicon dioxide. Note that instead of thermal oxidation, it is also possible to nitride or oxynitride the surface by heating.

Next, in the same way as in the eighth and ninth embodiments, an insulating film 3 is deposited (FIG. 50C) and etched to form sidewalls SW (FIG. 51A).

Further, the top surface of the sacrificial layer 40 is exposed, then the sacrificial layer 40 is selectively removed (FIG. 51B), a conductive film 4 is deposited (FIG. 51C), and this is ground and/or polished to form a plurality of word lines WL1 to WL5 (FIG. 51D).

In the 10th embodiment, it is possible to effectively improve the insulation characteristics of the dielectric between the word lines just by thermal oxidation or other processing. Note that since the sacrificial layer 40 is comprised of a conductive material unlike the sidewalls etc., there is the advantage that selective etching is easy.

11TH EMBODIMENT

The 11th embodiment shows a second modification of the formation of word lines of a nonvolatile memory.

FIG. 52A to FIG. 52C and FIG. 53A to FIG. 53C are sectional views along the line width direction centered on the word line portion. This embodiment may also be applied to any type of memory cell array of the eighth and ninth embodiments.

Figure 53A:
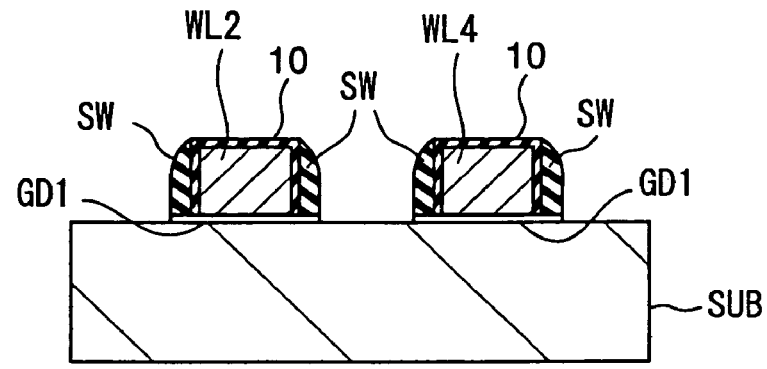
FIGS. 53A to 53C are sectional views of the state up to formation of word lines in the production of the semiconductor memory device according to the 11th embodiment.
Figure 53B:
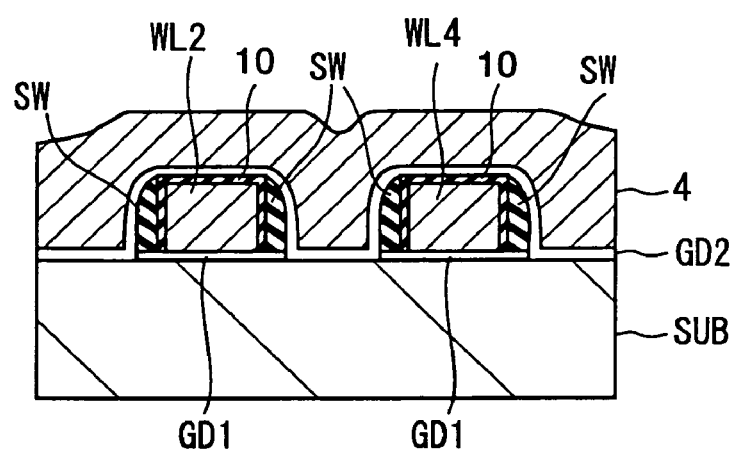
Figure 53C:
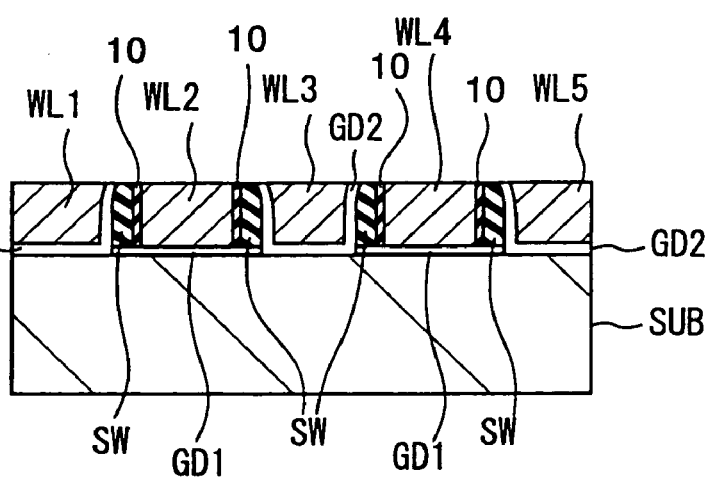

In the interconnect line isolation structure of the 11th embodiment, as shown in FIG. 53C, as multilayer films having a charge storage capacity, there are the first charge storage film GD1 between the first shape word lines WL2, WL4, . . . and substrate SUB and between the sidewalls SW and substrate SUB and the second charge storage film GD1 between the second shape word lines WL1, WL3, . . . and substrate SUB. Further, a thin thermal oxide film 10 is interposed between the first shape word lines WL2, WL4, . . . and the sidewalls SW. This embodiment differs from the eighth and ninth embodiments in these points.

The first charge storage film GD1 and second charge storage film GD2 are the same in specifications of the film structures.

The thermal oxide film 10 is obtained by thermal oxidation of the surfaces of the first shape word lines WL2, WL4, . . . when they are comprised of doped polycrystalline silicon or doped amorphous silicon. Therefore, the controllability of the film thickness is extremely high. Further, since the film is silicon dioxide obtained by thermal oxidation, it is good in quality. Therefore, there is the advantage that the insulation characteristics between interconnect lines are improved.

Figure 52A:
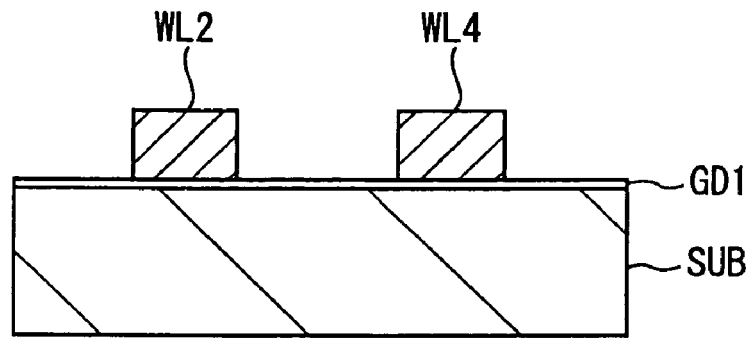
FIGS. 52A to 52C are sectional views of the state up to deposition of a dielectric in the production of a semiconductor device according to an 11th embodiment of the present invention.

In the formation of this interconnect line structure, first, as shown in FIG. 52A, the substrate SUB is formed with a first charge storage film GD1, then formed with first shape word lines WL2, WL4 . . . at a pitch about twice the final pitch. The first shape word lines WL2, WL4, . . . are formed from doped polycrystalline silicon or doped amorphous silicon.

Figure 52B:
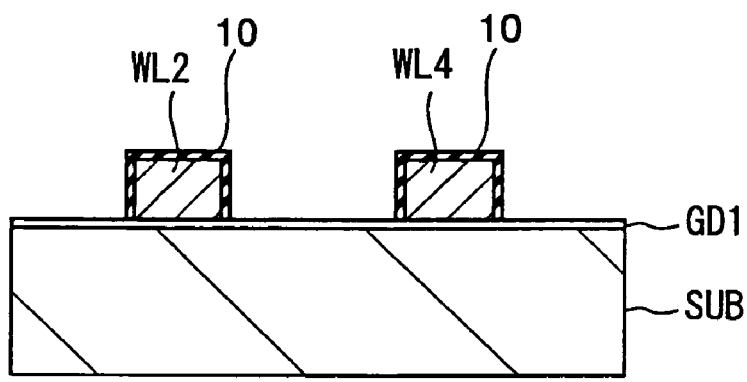
Figure 52C:
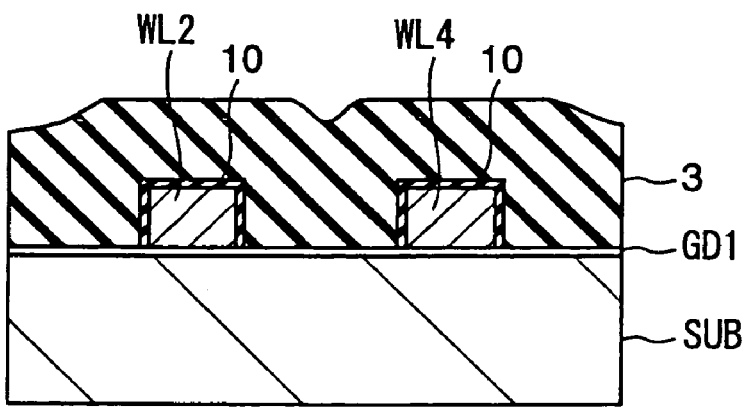

As shown in FIG. 52B, the surfaces of the first shape word lines WL2, WL4, . . . are thermally oxidized to form the thermal oxide film 10 comprised of several nm to several tens of nm or so of silicon dioxide. Note that instead of thermal oxidation, nitridation or oxynitridation by heating are also possible.

Next, in the same way as the eighth and ninth embodiments, the insulating film 3 is deposited (FIG. 52C) and etched to form the sidewalls SW (FIG. 53A).

Here, in the 11th embodiment, as shown in FIG. 53A, the first shape word lines WL2, WL4, . . . and sidewalls SW are used as a mask to remove the surrounding first charge storage film GD1.

Next, the second charge storage film GD2 is formed over the entire surface, then the conductive film 4 is deposited (FIG. 53B) and this is ground and/or polished to form the plurality of word lines WL1 to WL5 (FIG. 53C).

In the 11th embodiment, it is possible to effectively improve the insulation characteristics of the dielectric between the word lines by just thermal oxidation or other processing. Further, steps for partial removal and reformation of the charge storage film are added, but the first shape word lines are not removed, so the number of steps does not change much.

Summarizing the effects of the present invention, it is possible to greatly reduce the distance between word lines and other interconnect lines of for example semiconductor memory devices to less than the limit of photolithography and as a result slash waste of space. In particular, when applying this interconnect line isolation structure to isolation of word lines of a memory cell array, it is possible to greatly reduce the dimensions of the memory cells in the column direction and greatly reduce the bit cost by that extent.

Further, it is possible to takeout electrodes though the pitch of word lines is small.

Further, with the method of producing a semiconductor device according to the present invention, the above interconnect line isolation structure can be easily formed without using any special process and by using ordinary photolithography and etching techniques.

The distance between interconnect lines is defined by the thickness of the insulating film and/or the width of the sidewall insulating layer.

The insulating film can be controlled to an extremely high precision as is well known.

Further, the width of the sidewall insulating layer can be controlled by the height of the sacrificial layer or first shape interconnect lines and the etching conditions of the dielectric. The etching at the time of formation of the sidewall insulating layer is normally performed under strongly anisotropic conditions, so even if the etching time fluctuates somewhat, there is little variation in the width of the sidewalls. Therefore, the uniformity of the width of the sidewall insulating layer is comparatively high. Further, when an insulating film is interposed in addition to the sidewall insulating layer, the width is determined by the film thickness, so is extremely uniform.

Due to this, the fluctuation in distance between interconnect lines is considerably small.

Further, with the method of production according to the present invention, it is possible to keep down to a minimum the introduction of substrate damage and etching of the first word lines.

Due to the introduction of etching of the substrate surface, fluctuation in thickness of the charge storage film due to formation of the first word lines and second word lines in two steps is effectively suppressed and fluctuations in characteristics are prevented.

Further, since there is a step of electrical isolation (removal of residue) of the second word lines, it is possible to keep over etching to the minimum necessary and maintain the insulation and isolation characteristics between the word lines at a high level when forming the second word lines. Further, it is possible to suppress or prevent leakage current at the time of reading data.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2002-007085, filed on 16 Jan. 2001, the disclosure of which is expressly incorporated herein by reference in its entirety.

What is claimed is:

1. A semiconductor device comprising:

a plurality of memory transistors arranged in an array;

a plurality of word lines extending in a row direction and repeating at distances in a column direction, said word lines being gate electrodes for said plurality of memory transistors;

a first charge storage film on a semiconductor, said first charge storage film including a plurality of first films and having a first charge storage capability;

first word lines of said plurality of word lines on said first charge storage film and in parallel with each other at predetermined distances;

a second charge storage film covering surfaces of said first word lines and surfaces of said semiconductor exposed between said first word lines, said second charge storage film including a plurality of second films and having a second charge storage capability;

second word lines of said plurality of word lines facing said surfaces of said semiconductor exposed between said first word lines across said second charge storage film, said second word lines being insulated and isolated from said first word lines by said second charge storage film;

a first word line drive circuit connected to at least one of the outermost second word lines and supplying a predetermined voltage for turning off a channel at all times regardless of an amount of stored charge in said second charge storage film directly under said second word line or injecting a sufficient amount of charge to said second charge storage film by supplying a voltage for turning off the channel at all times; and a second word line drive circuit connected to said first or second word lines and controlling, based on an input row address signal, a voltage suitable for input and output of a charge to a first or second charge storage film directly under said first or second word lines or a voltage suitable for turning on or off a channel in accordance with the amount of stored charge in said first or second charge storage film, wherein the number of said second word lines is one larger than the number of said first word lines, wherein said first word lines and said second word lines extend outward from a memory cell array region and then are bent in a direction different from a direction of arrangement of said word lines, and wherein a pitch of arrangement between said first word lines and said second word lines at front end sides from said bent portions is set larger than a pitch of arrangement between said first word lines and said second word lines in said memory cell array.

* * * * *